US011054309B2

(12) United States Patent
Suzuki et al.

(10) Patent No.: US 11,054,309 B2
(45) Date of Patent: Jul. 6, 2021

(54) OPTICAL MODULE

(71) Applicant: HAMAMATSU PHOTONICS K.K., Hamamatsu (JP)

(72) Inventors: Tomofumi Suzuki, Hamamatsu (JP); Kyosuke Kotani, Hamamatsu (JP); Tatsuya Sugimoto, Hamamatsu (JP); Yutaka Kuramoto, Hamamatsu (JP); Katsumi Shibayama, Hamamatsu (JP); Noburo Hosokawa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/625,682

(22) PCT Filed: Jul. 6, 2018

(86) PCT No.: PCT/JP2018/025648
§ 371 (c)(1),
(2) Date: Dec. 21, 2019

(87) PCT Pub. No.: WO2019/009404
PCT Pub. Date: Jan. 10, 2019

(65) Prior Publication Data
US 2020/0124479 A1   Apr. 23, 2020

(30) Foreign Application Priority Data

Jul. 6, 2017 (JP) .............................. JP2017-133089

(51) Int. Cl.
*G01J 3/45* (2006.01)
*G01J 3/14* (2006.01)
(Continued)

(52) U.S. Cl.
CPC ................ *G01J 3/14* (2013.01); *B81B 3/007* (2013.01); *G01B 9/02049* (2013.01);
(Continued)

(58) Field of Classification Search
CPC .. G01J 3/14; G01J 3/021; G01J 3/0237; G01J 3/108; G01J 3/45; G01J 2003/104; G01B 9/02049; G01B 9/02051
See application file for complete search history.

(56) References Cited

U.S. PATENT DOCUMENTS 5,585,922 A   12/1996  Sueyoshi
5,870,221 A    2/1999  Goossen
(Continued)

FOREIGN PATENT DOCUMENTS

CN        1776476 A    5/2006
CN     101285771 A   10/2008
(Continued)

OTHER PUBLICATIONS

International Preliminary Report on Patentability dated Jan. 16, 2020 for PCT/JP2018/025648.
(Continued)

*Primary Examiner* — Jonathan M Hansen
(74) *Attorney, Agent, or Firm* — Faegre Drinker Biddle & Reath LLP

(57) ABSTRACT

An optical module 1A includes a mirror unit 2 including a movable mirror 22 and a fixed mirror 16, a beam splitter unit 3, a light incident unit 4, a first light detector 6, a second light source 7, a second light detector 8, a holding unit 130, a first mirror 51, a second mirror 52, and a third mirror 53. The holding unit 130 holds the first light detector 6, the second light detector 8, and the second light source 7 so as to face that same side, and to be aligned in this order. A length of an optical path between the unit 3 and the detector 6 is shorter than a length of an optical path between the unit 3 and the detector 8, and a length of an optical path between the unit 3 and the source 7.

10 Claims, 21 Drawing Sheets

(51) Int. Cl.
*B81B 3/00* (2006.01)
*G01J 3/02* (2006.01)
*G01J 3/10* (2006.01)
*G01B 9/02* (2006.01)
*G02B 7/182* (2021.01)
*G02B 26/08* (2006.01)

(52) U.S. Cl.
CPC ............ *G01J 3/021* (2013.01); *G01J 3/0237* (2013.01); *G01J 3/108* (2013.01); *G01J 3/45* (2013.01); *G02B 7/182* (2013.01); *G02B 26/0816* (2013.01); *B81B 2201/042* (2013.01); *G01J 2003/104* (2013.01)

(56) References Cited

U.S. PATENT DOCUMENTS

| | | | |
|---|---|---|---|
| 6,535,290 | B1 | 3/2003 | Spanner et al. |
| 2002/0167730 | A1 | 11/2002 | Needham et al. |
| 2005/0275847 | A1* | 12/2005 | Moshe ............... G01J 3/021 356/456 |
| 2006/0238768 | A1 | 10/2006 | Brorson et al. |
| 2007/0216907 | A1 | 9/2007 | Wang et al. |
| 2008/0024767 | A1 | 1/2008 | Seitz |
| 2008/0187325 | A1 | 8/2008 | McCallion et al. |
| 2008/0284078 | A1 | 11/2008 | Wolter et al. |
| 2009/0153844 | A1 | 6/2009 | Peter et al. |
| 2010/0067022 | A1* | 3/2010 | Nebosis ............ G01B 9/02091 356/497 |
| 2010/0238456 | A1 | 9/2010 | Speake et al. |
| 2011/0043661 | A1 | 2/2011 | Podoleanu |
| 2011/0090551 | A1 | 4/2011 | Pirk et al. |
| 2012/0249984 | A1 | 10/2012 | De Boer et al. |
| 2013/0148966 | A1* | 6/2013 | Kurokawa ........... G02B 6/4213 398/65 |
| 2014/0022546 | A1 | 1/2014 | Nagai et al. |
| 2014/0192365 | A1 | 7/2014 | Mortada et al. |
| 2014/0234179 | A1 | 8/2014 | Bita |
| 2015/0168215 | A1 | 6/2015 | Day et al. |
| 2015/0346479 | A1 | 12/2015 | Hirokubo |
| 2016/0231172 | A1 | 8/2016 | Medhat et al. |
| 2017/0018908 | A1 | 1/2017 | Nakanishi |
| 2017/0363469 | A1 | 12/2017 | Sabry et al. |
| 2019/0033136 | A1 | 1/2019 | Warashina et al. |

FOREIGN PATENT DOCUMENTS

| | | |
|---|---|---|
| CN | 101583857 A | 11/2009 |
| CN | 101871816 A | 10/2010 |
| CN | 102759402 A | 10/2012 |
| CN | 103076090 A | 5/2013 |
| CN | 103547528 A | 1/2014 |
| CN | 103885177 A | 6/2014 |
| CN | 104034422 A | 9/2014 |
| CN | 205262613 U | 5/2016 |
| CN | 105890758 A | 8/2016 |
| CN | 106500591 A | 3/2017 |
| DE | 102006032267 A1 | 5/2007 |
| EP | 0491435 A2 | 6/1992 |
| EP | 1193523 A2 | 4/2002 |
| EP | 2157467 A2 | 2/2010 |
| GB | 2163548 A | 2/1986 |
| GB | 2344168 A | 5/2000 |
| JP | H03-24440 A | 2/1991 |
| JP | H04-323502 A | 11/1992 |
| JP | H05-172738 A | 7/1993 |
| JP | H07-190712 A | 7/1995 |
| JP | H10-253912 A | 9/1998 |
| JP | H10-281719 A | 10/1998 |
| JP | H11-183116 A | 7/1999 |
| JP | 2001-296483 A | 10/2001 |
| JP | 2004-233412 A | 8/2004 |
| JP | 2005-223111 A | 8/2005 |
| JP | 2005-292033 A | 10/2005 |
| JP | 2006-343481 A | 12/2006 |
| JP | 2007-21044 A | 2/2007 |
| JP | 2008-233405 A | 10/2008 |
| JP | 2009-42456 A | 2/2009 |
| JP | 2010-054944 A | 3/2010 |
| JP | 2010-096997 A | 4/2010 |
| JP | 2010-128116 A | 6/2010 |
| JP | 2010-170029 A | 8/2010 |
| JP | 2010-184334 A | 8/2010 |
| JP | 2012-107962 A | 6/2012 |
| JP | 2012-524295 A | 10/2012 |
| JP | 2012-240129 A | 12/2012 |
| JP | 2012-242450 A | 12/2012 |
| JP | 2015-32739 A | 2/2015 |
| JP | 2015-148781 A | 8/2015 |
| JP | 2015-225153 A | 12/2015 |
| JP | 2016-90250 A | 5/2016 |
| JP | 2016-515946 A | 6/2016 |
| JP | 2017-097304 A | 6/2017 |
| JP | 6461446 B1 | 1/2019 |
| WO | WO 03/085371 A2 | 10/2003 |
| WO | WO-2010/121185 A1 | 10/2010 |
| WO | WO-2010/122879 A1 | 10/2010 |
| WO | WO 2011/037015 A1 | 3/2011 |
| WO | WO-2011/061514 A1 | 5/2011 |
| WO | WO-2012/164810 A1 | 12/2012 |
| WO | WO 2014/117158 A1 | 7/2014 |
| WO | WO 2016/007272 A1 | 1/2016 |
| WO | WO-2016/080317 A1 | 5/2016 |
| WO | WO-2016/166872 A1 | 10/2016 |
| WO | WO 2017/087061 A1 | 5/2017 |

OTHER PUBLICATIONS

International Preliminary Report on Patentability dated Jan. 16, 2020 for PCT/JP2018/025633.
International Preliminary Report on Patentability dated Jan. 16, 2020 for PCT/JP2018/025644.
International Preliminary Report on Patentability dated Jan. 16, 2020 for PCT/JP2018/025646.
International Preliminary Report on Patentability dated Jan. 16, 2020 for PCT/JP2018/025641.
International Preliminary Report on Patentability dated Jan. 16, 2020 for PCT/JP2018/025642.
International Preliminary Report on Patentability dated Jan. 16, 2020 for PCT/JP2018/025645.
Lu Anjiang et al., "Fourier transform infrared spectrometer based on electro-thermal MEMS micro-mirror," Infrared and Laser Engineering, vol. 45, No. 5, May 2016 (incl. English Abstract).

* cited by examiner

Fig.20
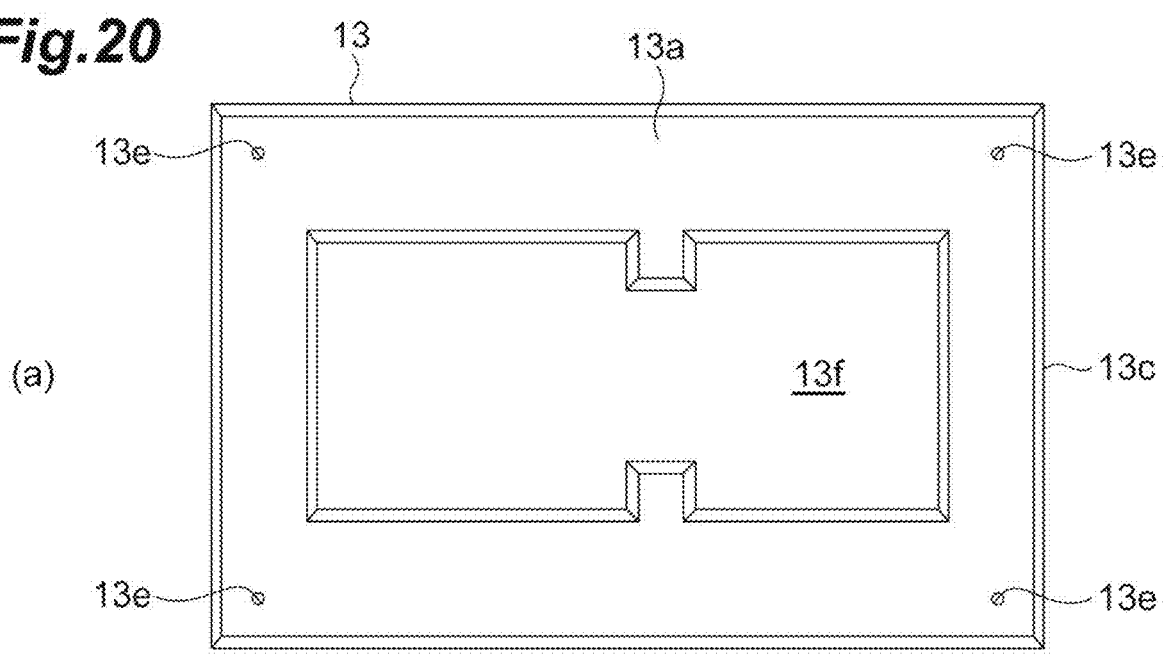
(a)
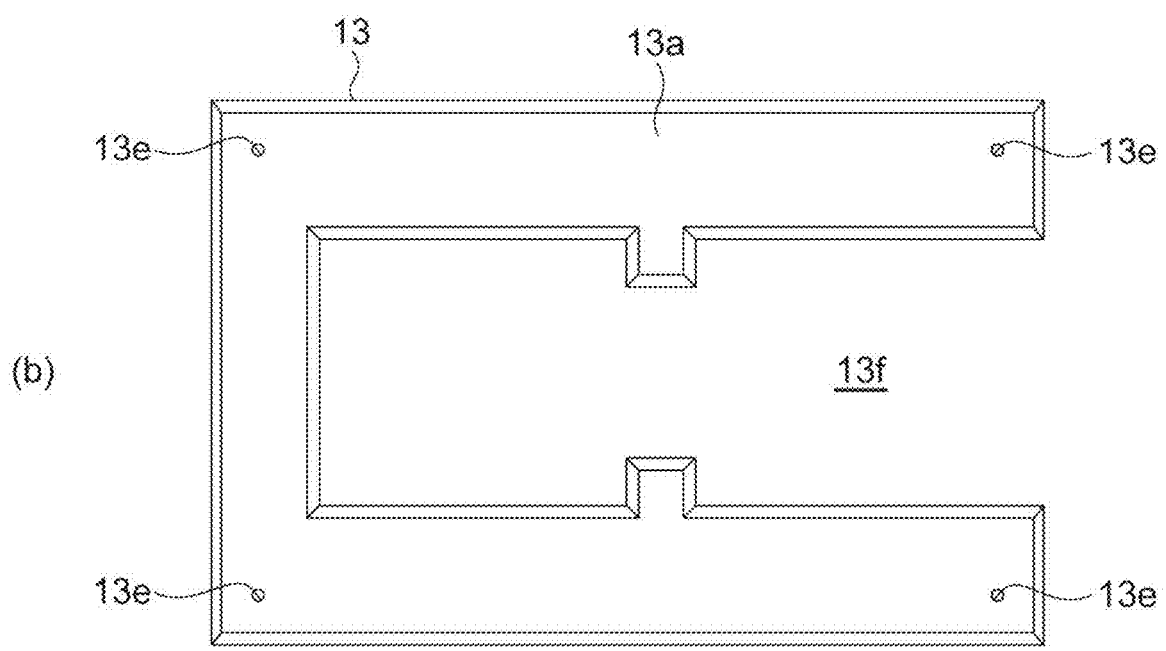
(b)

OPTICAL MODULE

TECHNICAL FIELD

The present disclosure relates to an optical module.

BACKGROUND ART

As a micro electro mechanical systems (MEMS) device that is constituted by a silicon on insulator (SOI) substrate, an optical module in which respective parts constituting an interference optical system are formed in the SOI substrate is known (for example, refer to Patent Literature 1).

CITATION LIST

Patent Literature

Patent Literature 1: Japanese Translation of PCT International
  Application Publication No. 2012-524295

SUMMARY OF INVENTION

Technical Problem

The above-described optical module can provide high-accuracy Fourier transformation type infrared spectral analyzer (FTIR), and thus the mirror module has attracted attention.

An object of the present disclosure is to provide an optical module capable of realizing high-accuracy spectral analysis in a simple configuration.

Solution to Problem

According to an aspect of the present disclosure, there is provided an optical module including: a mirror unit that includes a base including a first surface, a movable mirror that is supported in the base to be movable along a first direction that intersects the first surface, and a fixed mirror of which a position with respect to the base is fixed; a beam splitter unit that is disposed on one side of the mirror unit in the first direction, and constitutes an interference optical system in combination with the movable mirror and the fixed mirror; a light incident unit that causes measurement light that is incident from a first light source through a measurement target or measurement light that occurs from the measurement target to be incident to the beam splitter unit; a first light detector that detects interference light of the measurement light which is emitted from the beam splitter unit; a second light source that emits laser light to be incident to the beam splitter unit; a second light detector that detects interference light of the laser light which is emitted from the beam splitter unit; a holding unit that holds a first optical device, a second optical device, and a third optical device so that the first optical device that is the first light detector, the second optical device that is one of the second light source and the second light detector, and the third optical device that is the other of the second light source and the second light detector face the same side, and the first optical device, the second optical device, and the third optical device are aligned in this order; a first mirror that is a dichroic mirror that has a function of allowing the measurement light to be transmitted therethrough and reflecting the laser light, or a function of reflecting the measurement light and allowing the laser light to be transmitted therethrough and is inclined with respect to an optical axis of the first optical device, and is disposed to face the beam splitter unit and the first optical device; a second mirror that is a mirror that has a function of reflecting a part of the laser light and allowing the remainder of the laser light to be transmitted therethrough and is parallel to the first mirror, and is disposed to face the first mirror and the second optical device; and a third mirror that is a mirror that has a function of reflecting the laser light and is parallel to the second mirror, and is disposed to face the second mirror and the third optical device. A length of an optical path between the beam splitter unit and the first optical device is shorter than a length of an optical path between the beam splitter unit and the second optical device, and is shorter than a length of an optical path between the beam splitter unit and the third optical device.

In the optical module, the first optical device that is the first light detector, the second optical device that is one of the second light source and the second light detector, and the third optical device that is the other of the second light source and the second light detector are held by the holding unit to face the same side. Accordingly, it is possible to constitute an interference optical system relating to the measurement light and an interference optical system relating to the laser light with a simple layout, and it is possible to perform spectral analysis based on a detection result of interference light of the measurement light while acquiring a position of the movable mirror in the first direction based on a detection result of interference light of the laser light. In addition, the first optical device that is the first light detector, the second optical device that is one of the second light source and the second light detector, and the third optical device that is the other of the second light source and the second light detector are held by the holding unit to be aligned in this order, and thus the length of the optical path between the beam splitter unit and the first optical device is shorter than the length of the optical path between the beam splitter unit and the second optical device, and is shorter than the length of the optical path between the beam splitter unit and the third optical device. Accordingly, it is possible to detect the interference light of the measurement light with a sufficient light amount. As described above, according to the optical module, it is possible to realize high-accuracy spectral analysis with a simple configuration.

In the optical module according to the aspect of the present disclosure, the second optical device may be the second light detector, and the third optical device may be the second light source.

Accordingly, it is possible to realize simplification of a configuration of a circuit substrate for signal input/output with respect to the first optical device, the second optical device, and the third optical device.

The optical module according to the aspect of the present disclosure may further include an aperture that is disposed between the first mirror and the first optical device, and the aperture may be held by the holding unit. Accordingly, a deviation is less likely to occur in a mutual positional relationship of the aperture and the first light detector. In addition, it is possible to realize higher accurate spectral analysis by cutting out an outer edge portion that may become a noise in the interference light of the measurement light. In addition, it is possible to reduce a variation of a phase difference in a beam plane in the interference light of the measurement light which is detected by the first light detector.

The optical module according to the aspect of the present disclosure may further include a filter that is disposed between the light incident unit and the beam splitter unit, and the filter may have a function of cutting off the laser light, and may be disposed in a state of being inclined with respect to an optical axis of the light incident unit. Accordingly, even when light in the same wavelength range as the laser light is included in the measurement light, the light is prevented from being incident to the beam splitter unit, and thus it is possible to obtain a position of the movable mirror in the first direction with accuracy based on a detection result of the interference light of the laser light. In addition, since the filter is inclined with respect to the optical axis of the light incident unit, light in the same wavelength range as the laser light is reflected to the outside of an interference optical system, and thus it is possible to reliably prevent the light from being stray light.

According to another aspect of the present disclosure, there is provided an optical module including: a mirror unit that includes a base including a first surface, a movable mirror that is supported in the base to be movable along a first direction that intersects the first surface, and a fixed mirror of which a position with respect to the base is fixed; a beam splitter unit that is disposed on one side of the mirror unit in the first direction, and constitutes an interference optical system in combination with the movable mirror and the fixed mirror; a first light source that emits measurement light to be incident to the beam splitter unit; a first light detector that detects interference light of the measurement light which is emitted from the beam splitter unit and is incident through a measurement target; a second light source that emits laser light to be incident to the beam splitter unit; a second light detector that detects interference light of the laser light which is emitted from the beam splitter unit; a holding unit that holds a first optical device, a second optical device, and a third optical device so that the first optical device that is the first light source, the second optical device that is one of the second light source and the second light detector, and the third optical device that is the other of the second light source and the second light detector face the same side, and the first optical device, the second optical device, and the third optical device are aligned in this order; a first mirror that is a dichroic mirror that has a function of allowing the measurement light to be transmitted therethrough and reflecting the laser light, or a function of reflecting the measurement light and allowing the laser light to be transmitted therethrough and is inclined with respect to an optical axis of the first optical device, and is disposed to face the beam splitter unit and the first optical device; a second mirror that is a mirror that has a function of reflecting a part of the laser light and allowing the remainder of the laser light to be transmitted therethrough and is parallel to the first mirror, and is disposed to face the first mirror and the second optical device; and a third mirror that is a mirror that has a function of reflecting the laser light and is parallel to the second mirror, and is disposed to face the second mirror and the third optical device. A length of an optical path between the beam splitter unit and the first optical device is shorter than a length of an optical path between the beam splitter unit and the second optical device, and is shorter than a length of an optical path between the beam splitter unit and the third optical device.

In the optical module, the first optical device that is the first light source, the second optical device that is one of the second light source and the second light detector, and the third optical device that is the other of the second light source and the second light detector are held by the holding unit to face the same side. Accordingly, it is possible to constitute an interference optical system relating to the measurement light and an interference optical system relating to the laser light with a simple layout, and it is possible to perform spectral analysis based on a detection result of interference light of the measurement light while acquiring a position of the movable mirror in the first direction based on a detection result of interference light of the laser light. In addition, the first optical device that is the first light source, the second optical device that is one of the second light source and the second light detector, and the third optical device that is the other of the second light source and the second light detector are held by the holding unit to be aligned in this order, and thus the length of the optical path between the beam splitter unit and the first optical device is shorter than the length of the optical path between the beam splitter unit and the second optical device, and is shorter than the length of the optical path between the beam splitter unit and the third optical device. Accordingly, it is possible to detect the interference light of the measurement light with a sufficient light amount. As described above, according to the optical module, it is possible to realize high-accuracy spectral analysis with a simple configuration.

In the optical module according to the aspect of the present disclosure, the second optical device may be the second light source, and the third optical device may be the second light detector. According to this, it is possible to realize simplification of a configuration of a circuit substrate for signal input/output with respect to the first optical device, the second optical device, and the third optical device.

The optical module according to the aspect of the present disclosure may further include an aperture that is disposed between the first mirror and the first optical device, and the aperture may be held by the holding unit. Accordingly, a deviation is less likely to occur in a mutual positional relationship of the aperture and the first light source. In addition, it is possible to realize higher accurate spectral analysis by cutting out an outer edge portion that may become a noise in the interference light of the measurement light. In addition, it is possible to reduce a variation of a phase difference in a beam plane in the interference light of the measurement light which is detected by the first light detector.

In the optical modules according to the aspects of the present disclosure, the first mirror, the second mirror, and the third mirror may be held by the holding unit. Accordingly, it is possible to integrally handle the first optical device, the second optical device, and the third optical device, and the first mirror, the second mirror, and the third mirror.

In the optical modules according to the aspects of the present disclosure, the holding unit may hold the first optical device, the second optical device, and the third optical device so that the first optical device, the second optical device, and the third optical device face the other side in the first direction on the one side of the beam splitter unit in the first direction. Accordingly, it is possible to realize a reduction in size of the optical module in a direction that intersects the first direction.

In the optical modules according to the aspects of the present disclosure, the holding unit may hold the first optical device, the second optical device, and the third optical device so that the first optical device, the second optical device, and the third optical device face the one side in the first direction on one side of the mirror unit in a second direction that intersects the first direction. Accordingly, it is possible to realize a reduction in size of the optical module in the first direction.

Advantageous Effects of Invention

According to the present disclosure, it is possible to provide an optical module capable of realizing high-accuracy spectral analysis with a simple configuration.

BRIEF DESCRIPTION OF DRAWINGS

FIG. 20 is a plan view of an optical function member of the modification example.

DESCRIPTION OF EMBODIMENTS

Figure 1:
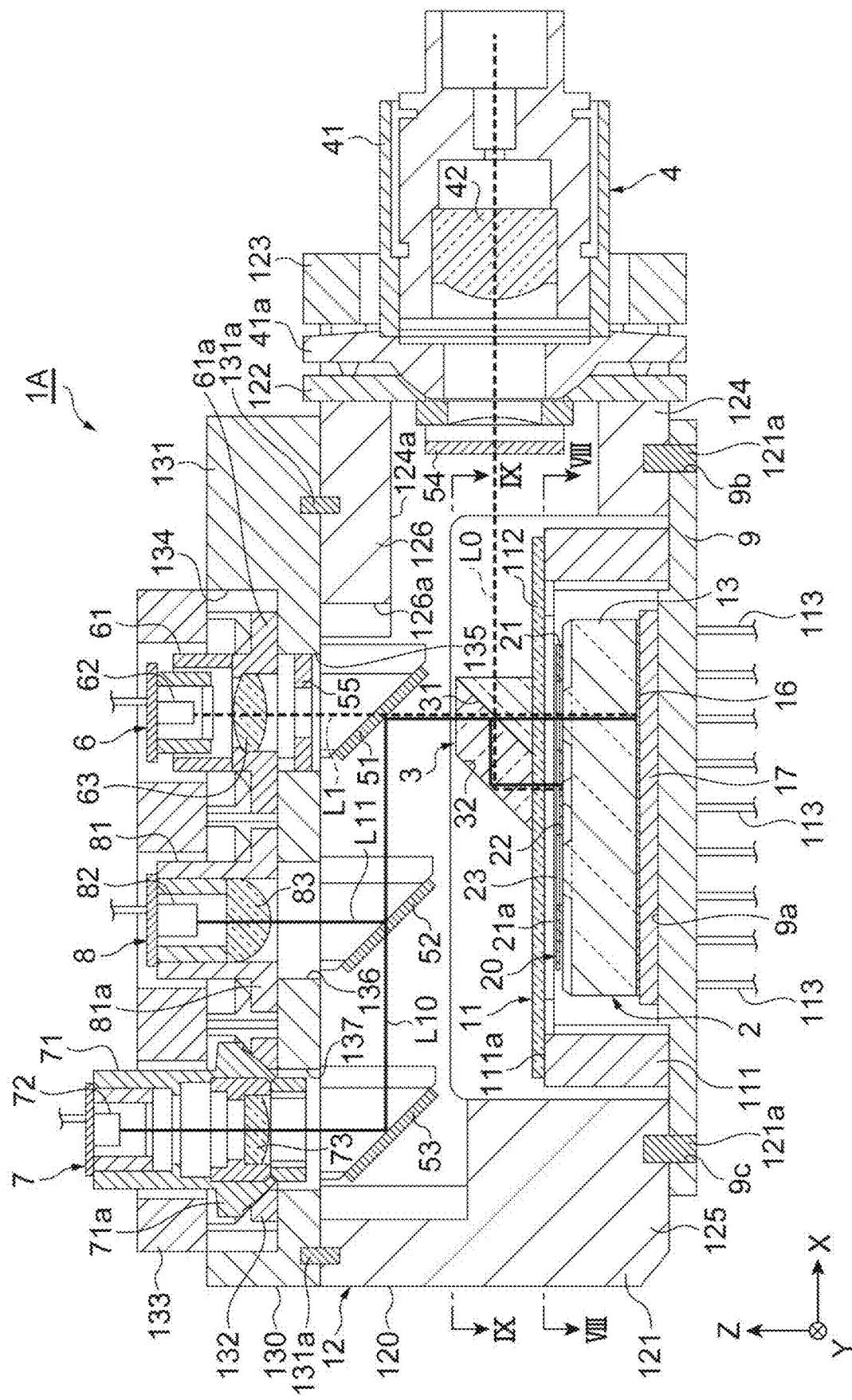
FIG. 1 is a cross-sectional view of an optical module of a first embodiment.

Hereinafter, an embodiment of the present disclosure will be described in detail with reference to the accompanying drawings. The same reference numeral will be given to the same or equivalent parts in the respective drawings, and redundant description thereof will be omitted.

First Embodiment

[Configuration of Optical Module]

As illustrated in FIG. 1, an optical module 1A includes a mirror unit 2, a beam splitter unit 3, a light incident unit 4, a first light detector 6, a second light source 7, a second light detector 8, a support 9, a first support structure 11, and a second support structure 12. The mirror unit 2 is disposed on one side of the support 9 in a Z-axis direction (first direction), and is attached to the support 9, for example, by an adhesive. For example, the support 9 is formed of copper tungsten, and has a rectangular plate shape. The mirror unit 2 includes a movable mirror 22 that moves in the Z-axis direction, and a fixed mirror 16 of which a position is fixed (details thereof will be described later). For example, the Z-axis direction is a vertical direction, and the one side in the Z-axis direction is an upper side.

The beam splitter unit 3 is disposed on one side of the mirror unit 2 in the Z-axis direction, and is supported by the first support structure 11. The first support structure 11 is attached to the support 9, for example, by an adhesive. The light incident unit 4 is disposed on one side of the beam splitter unit 3 in an X-axis direction (a second direction that intersects the first direction), and is supported by the second support structure 12. The first light detector 6, the second light source 7, and the second light detector 8 are disposed on the one side of the beam splitter unit 3 in the Z-axis direction, and are supported by the second support structure 12. The second support structure 12 is attached to the support 9, for example, by a bolt.

In the optical module 1A, an interference optical system is constituted by the beam splitter unit 3, the movable mirror 22, and the fixed mirror 16 with respect to each of measurement light L0 and laser light L10. The interference optical system which is constituted with respect to each of the measurement light L0 and the laser light L10 is, for example, a Michelson interference optical system.

With regard to the measurement light L0, interference light L1 of measurement light is detected as follows. That is, when the measurement light L0 that is incident from a first light source (not illustrated) through a measurement target (not illustrated) or the measurement light L0 that is generated from the measurement target (for example, light emitted from the measurement target itself, or the like) is incident to the beam splitter unit 3 from the light incident unit 4, the measurement light L0 is divided into a part and the remainder in the beam splitter unit 3. The part of the measurement light L0 is reflected by the movable mirror 22 that reciprocates in the Z-axis direction, and returns to the beam splitter unit 3. On the other hand, the remainder of the measurement light L0 is reflected by the fixed mirror 16 and returns to the beam splitter unit 3. The part and the remainder of the measurement light L0, which return to the beam splitter unit 3, are emitted from the beam splitter unit 3 as the interference light L1, and the interference light L1 of the measurement light is detected by the first light detector 6.

With regard to the laser light L10, interference light L11 of laser light is detected as follows. That is, when the laser light L10 emitted from the second light source 7 is incident to the beam splitter unit 3, the laser light L10 is divided into a part and the remainder in the beam splitter unit 3. The part of the laser light L10 is reflected by the movable mirror 22 that reciprocates in the Z-axis direction, and returns to the beam splitter unit 3. On the other hand, the remainder of the laser light L10 is reflected by the fixed mirror 16 and returns to the beam splitter unit 3. The part and the remainder of the laser light L10, which return to the beam splitter unit 3, are emitted from the beam splitter unit 3 as the interference light L11, and the interference light L11 of the laser light is detected by the second light detector 8.

According to the optical module 1A, measurement of a position of the movable mirror 22 in the Z-axis direction can be measured based on a detection result of the interference light L11 of the laser light, and spectral analysis with respect to the measurement target can be performed based on a measurement result of the position, and a detection result of the interference light L1 of the measurement light.

[Configuration of Mirror Unit]

Figure 2:
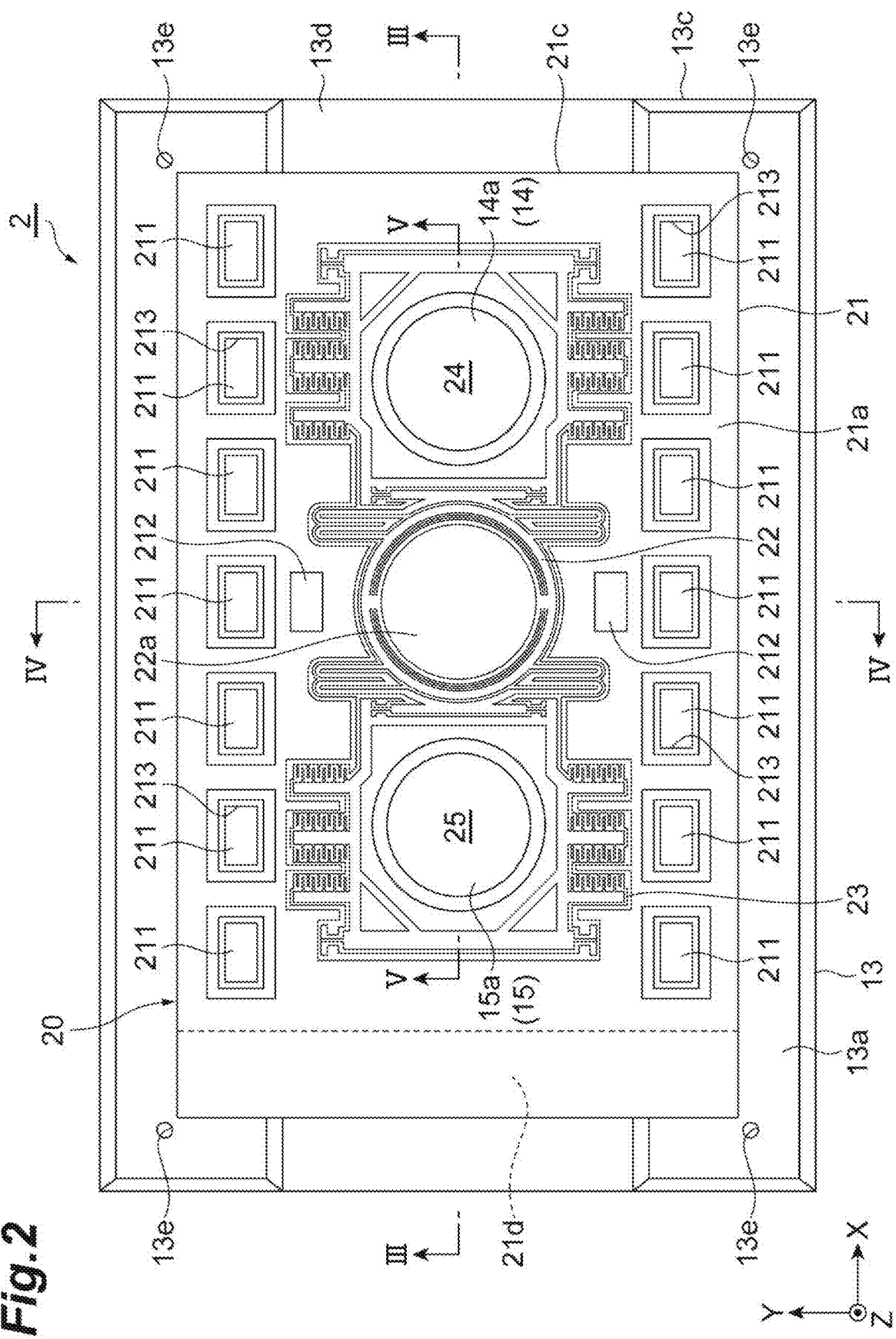
FIG. 2 is a plan view of a mirror unit illustrated in FIG. 1.
Figure 3:
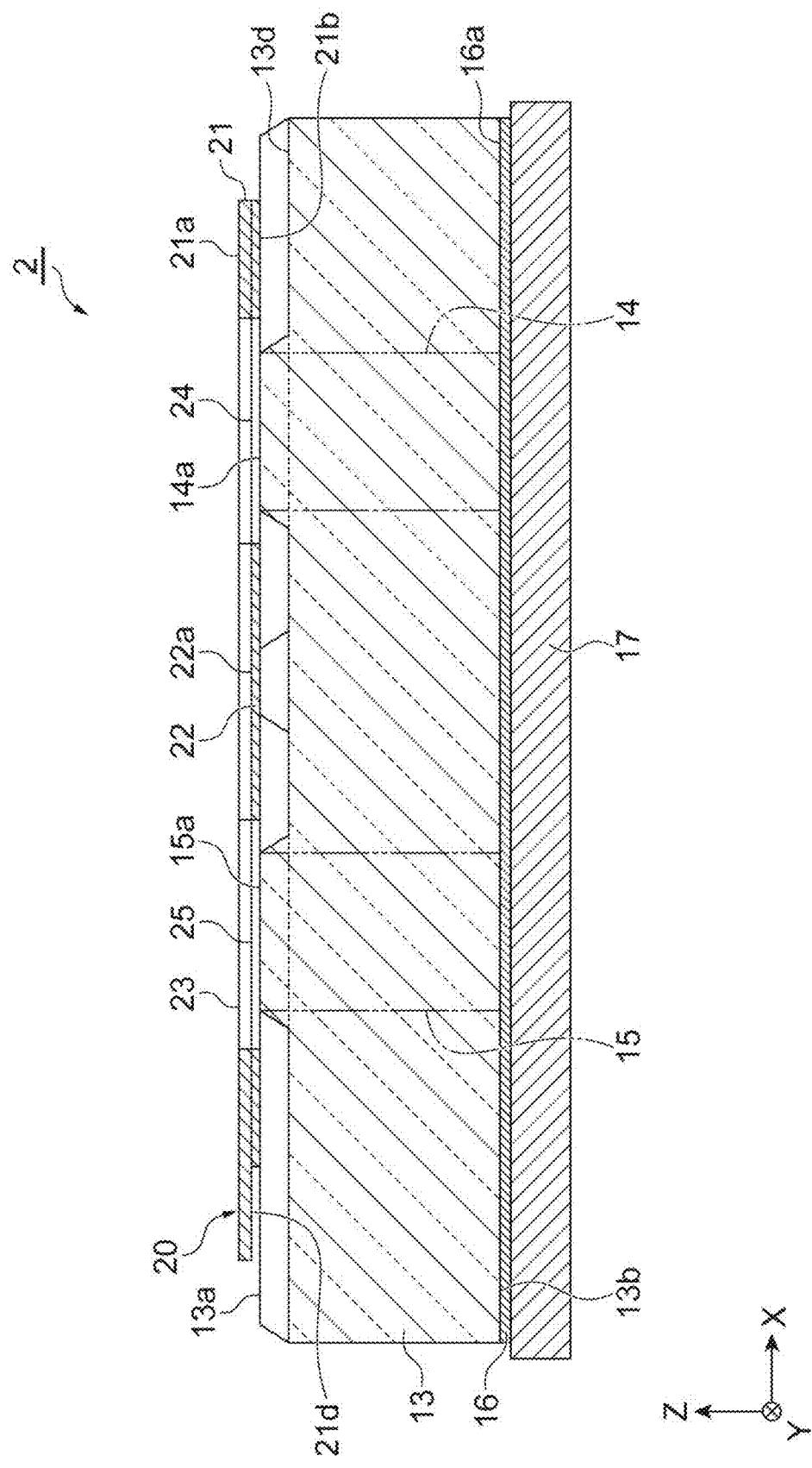
FIG. 3 is a cross-sectional view of the mirror unit which is taken along line illustrated in FIG. 2.
Figure 4:
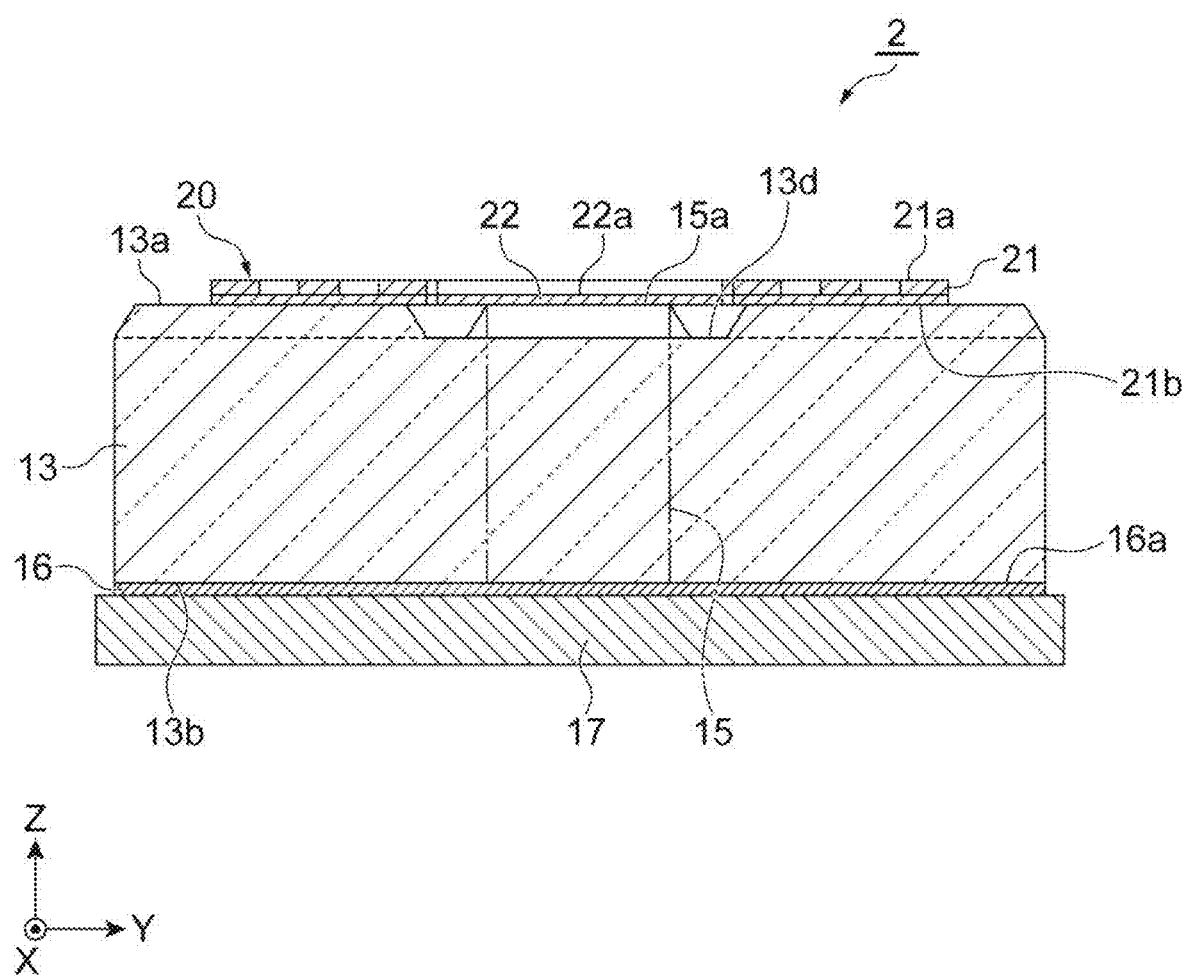
FIG. 4 is a cross-sectional view of the mirror unit which is taken along line IV-IV illustrated in FIG. 2.

As illustrated in FIG. 2, FIG. 3, and FIG. 4, the mirror unit 2 includes a mirror device 20, an optical function member 13, the fixed mirror 16, and a stress mitigation substrate 17. The mirror device 20 includes a base 21, the movable mirror 22, and a drive unit 23.

The base 21 includes a first surface 21a (surface on the one side in the Z-axis direction) and a second surface 21b opposite to the first surface 21a. Each of the first surface 21a and the second surface 21b is a main surface of the base 21. For example, the base 21 has a rectangular plate shape, and a size of approximately 10 mm×15 mm×0.35 mm (thickness). The movable mirror 22 includes a mirror surface 22a, and a movable unit 22b in which the mirror surface 22a is disposed. The movable mirror 22 is supported in the base 21 so that the movable mirror 22 can move in the Z-axis direction perpendicular to the first surface 21a (a first direction that intersects a first surface). The drive unit 23 moves the movable mirror 22 in the Z-axis direction.

A pair of light passage portions 24 and 25 are provided in the mirror device 20. The pair of light passage portions 24 and 25 are respectively disposed on both sides of the movable mirror 22 in the X-axis direction. The light passage portion 24 constitutes a first portion of an optical path between the beam splitter unit 3 and the fixed mirror 16. In this embodiment, the light passage portion 25 does not function as a light passage portion.

Figure 5:
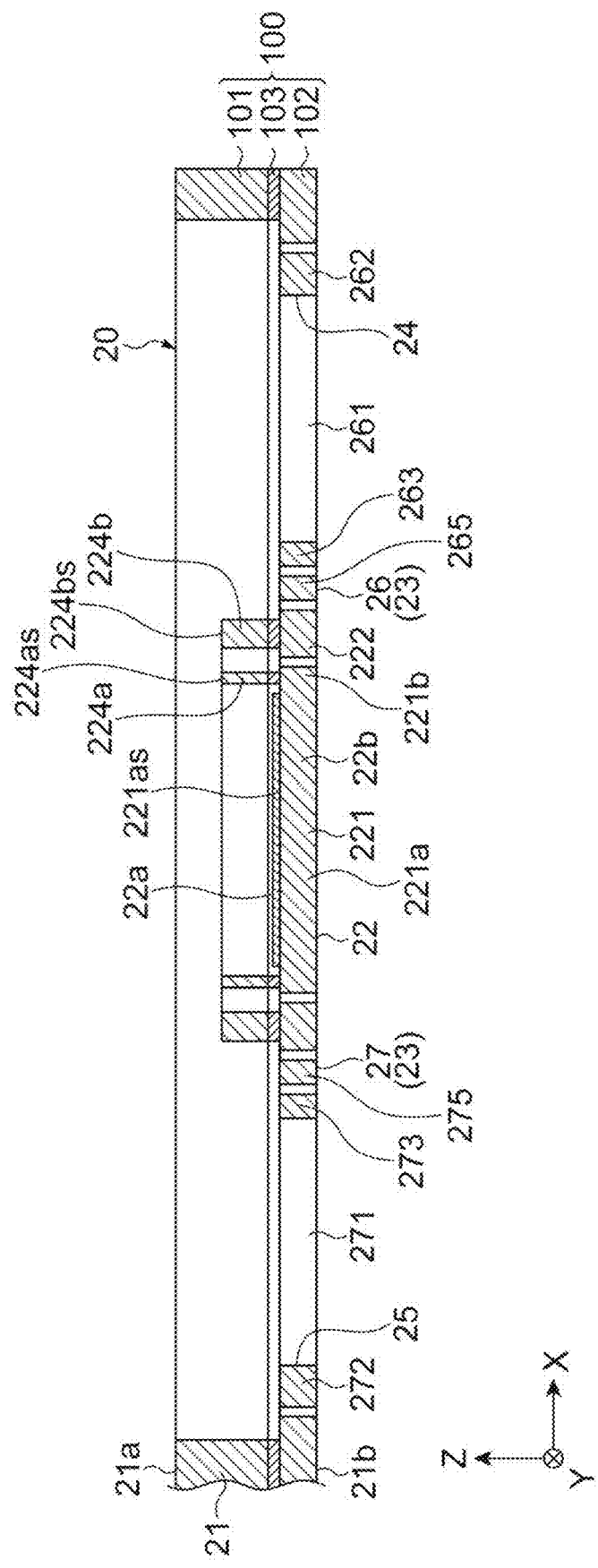
FIG. 5 is a schematic cross-sectional view of a mirror device which is taken along line V-V illustrated in FIG. 2.
Figure 6:
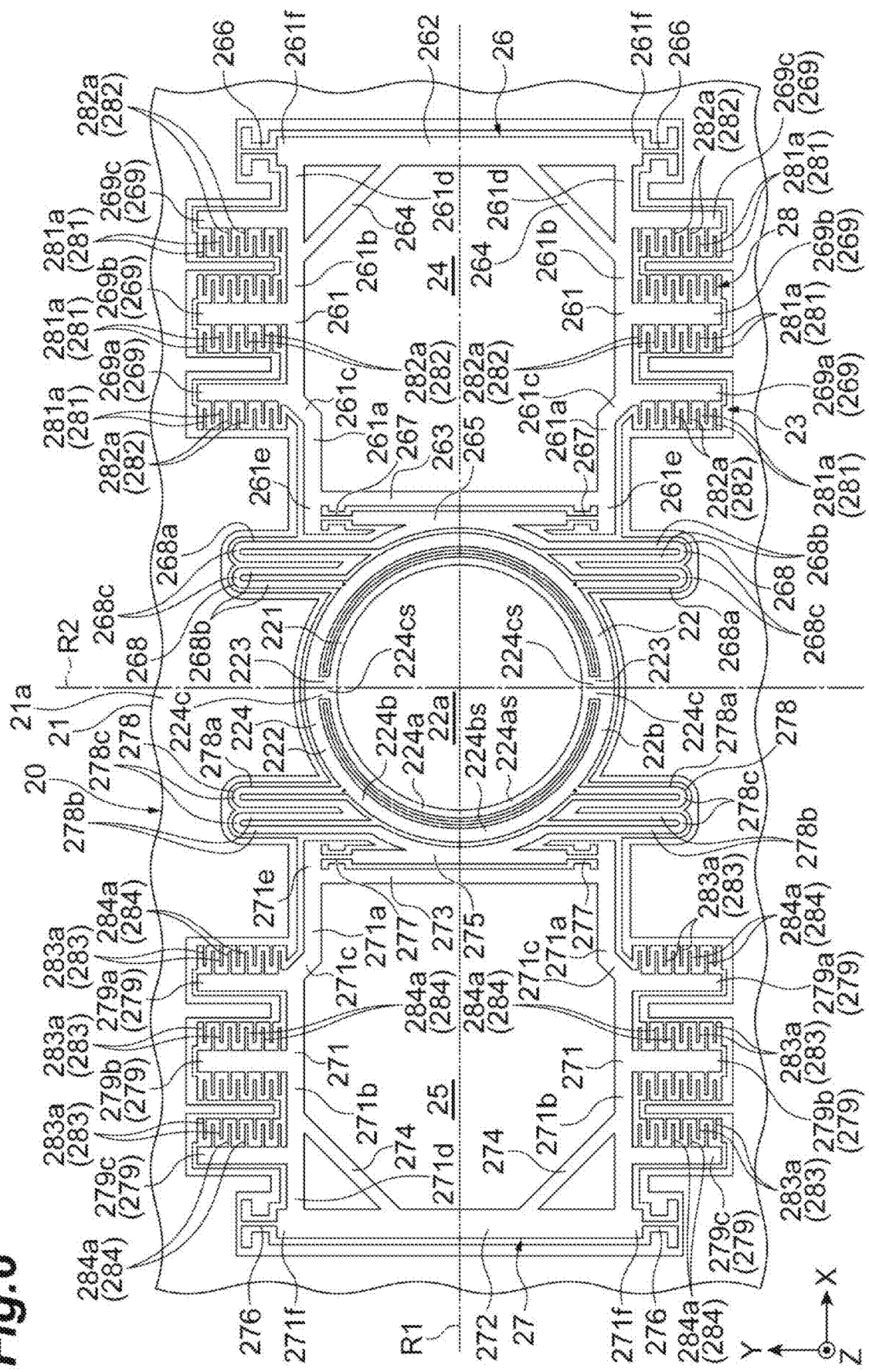
FIG. 6 is a partially enlarged view of the mirror device illustrated in FIG. 2.
Figure 7:
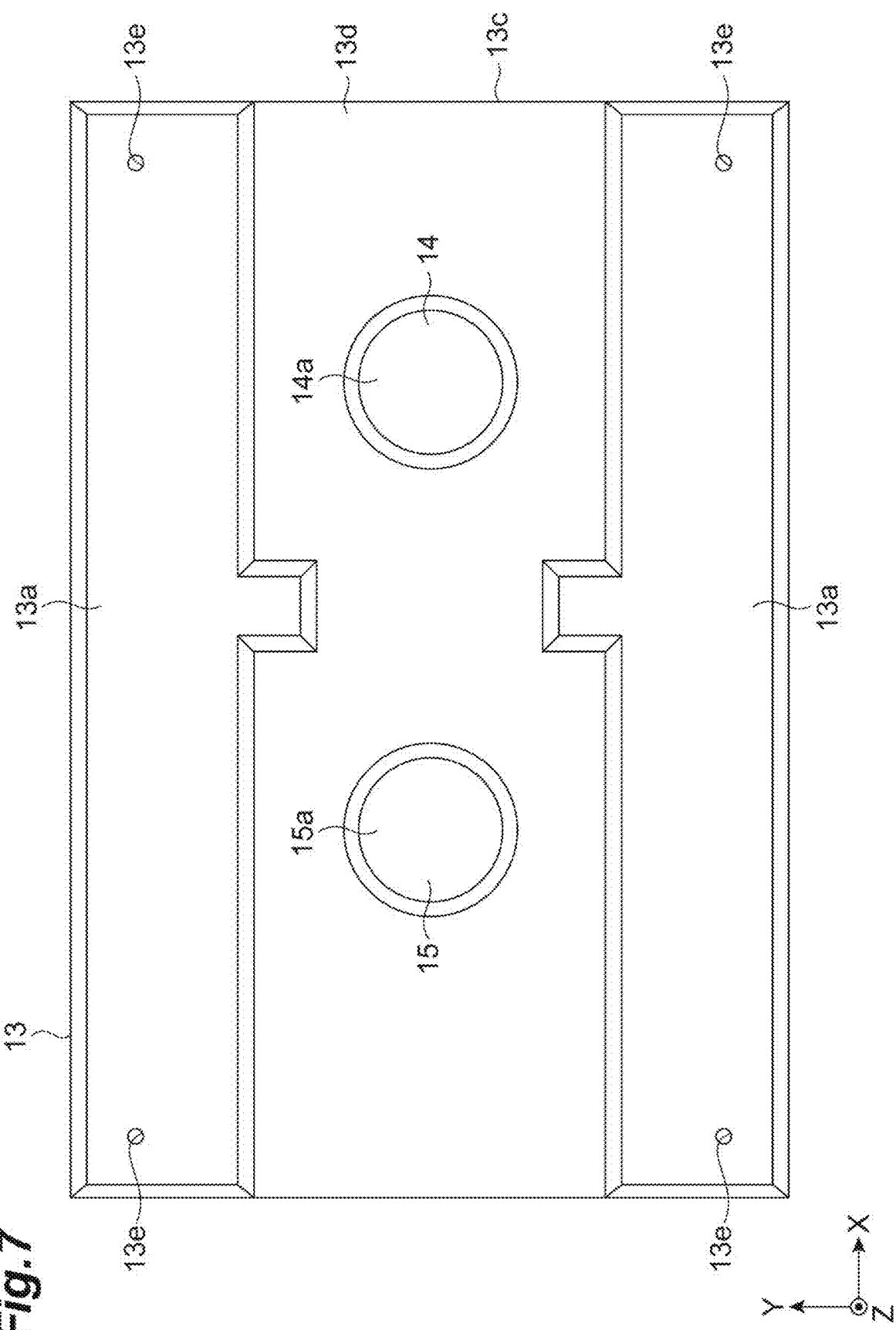
FIG. 7 is a plan view of an optical function member illustrated in FIG. 2.

Here, a configuration of the mirror device 20 will be described in detail with reference to FIG. 2, FIG. 5, and FIG. 6. FIG. 5 is a schematic cross-sectional view of the mirror device 20 illustrated in FIG. 3, and FIG. 5 schematically illustrates the mirror device 20, for example, in a state in which dimensions in the Z-axis direction are enlarged in comparison to actual dimensions.

The base 21, the movable unit 22b of the movable mirror 22, and the drive unit 23 are constituted by a silicon on insulator (SOI) substrate (semiconductor substrate) 100. That is, the mirror device 20 is constituted by the SOI substrate 100. For example, the mirror device 20 is formed in a rectangular plate shape. The SOI substrate 100 includes a support layer 101, a device layer 102, and an intermediate layer 103. The support layer 101 is a first silicon layer (a first semiconductor layer). The device layer 102 is a second silicon layer (a second semiconductor layer). The intermediate layer 103 is an insulating layer that is disposed between the support layer 101 and the device layer 102. The SOI substrate 100 includes the support layer 101, the intermediate layer 103, and the device layer 102 in this order from the one side in the Z-axis direction.

The base 21 is constituted by a part of the support layer 101, the device layer 102, and the intermediate layer 103. The first surface 21a of the base 21 is a surface of the support layer 101 which is opposite to the intermediate layer 103. The second surface 21b of the base 21 is a surface of the device layer 102 which is opposite to the intermediate layer 103. The support layer 101 that constitutes the base 21 is thicker than the device layer 102 that constitutes the base 21. For example, the thickness of the support layer 101 that constitutes the base 21 is approximately four times the thickness of the device layer 102 that constitutes the base 21. As will be described later, in the mirror unit 2, the second surface 21b of the base 21 and a third surface 13a of the optical function member 13 are jointed to each other (refer to FIG. 3 and FIG. 4).

The movable mirror 22 is disposed in a state in which an intersection between an axial line R1 and an axial line R2 is set as the central position (gravity center position). The axial line R1 is a straight line that extends in the X-axis direction. The axial line R2 is a straight line that extends in a Y-axis direction. When viewed from the Z-axis direction, in the mirror device 20, a portion other than a portion that overlaps a sixth surface 21d of the base 21 to be described later has a shape that is linearly symmetric to each of the axial line R1 and the axial line R2.

The movable mirror 22 (movable unit 22b) includes an arrangement portion 221, a frame portion 222, a pair of connection portions 223, and a rib portion 224. The arrangement portion 221, the frame portion 222, and the pair of connection portions 223 are constituted by a part of the device layer 102. The arrangement portion 221 has a circular shape when viewed from the Z-axis direction. The arrangement portion 221 includes a central portion 221a and an edge portion 221b. For example, the mirror surface 22a is provided on a surface 221as of the central portion 221a on the one side in the Z-axis direction by forming a metal film (metal layer) thereon. The mirror surface 22a extends in a direction perpendicular to the Z-axis direction, and has a circular shape. The surface 221as of the central portion 221a is a surface on the intermediate layer 103 side in the device layer 102. The mirror surface 22a is located on the other side in the Z-axis direction in comparison to the first surface 21a of the base 21. In other words, the first surface 21a is located on the one side in the Z-axis direction in comparison to the mirror surface 22a. The edge portion 221b surrounds the central portion 221a when viewed from the Z-axis direction.

The frame portion 222 extends in a ring shape to surround the arrangement portion 221 with a predetermined gap from the arrangement portion 221 when viewed from the Z-axis direction. For example, the frame portion 222 has a circular ring shape when viewed from the Z-axis direction. Each of the pair of connection portions 223 connects the arrangement portion 221 and the frame portion 222 to each other. The pair of connection portions 223 are respectively disposed on both sides of the arrangement portion 221 in the Y-axis direction.

The rib portion 224 is constituted by the support layer 101 and the intermediate layer 103 which are disposed on the device layer 102. The rib portion 224 includes an inner rib portion 224a, an outer rib portion 224b, and a pair of connection rib portions 224c. The inner rib portion 224a is disposed on a surface of the edge portion 221b on the one side in the Z-axis direction. The inner rib portion 224a surrounds the mirror surface 22a when viewed from the Z-axis direction. For example, an outer edge of the inner rib portion 224a extends along an outer edge of the arrangement portion 221 with a predetermined gap from the outer edge of the arrangement portion 221 when viewed from the Z-axis direction. An inner edge of the inner rib portion 224a extends along an outer edge of the mirror surface 22a with a predetermined gap from the outer edge of the mirror surface 22a when viewed from the Z-axis direction. An end surface 224as of the inner rib portion 224a on the one side in the Z-axis direction is located on the one side in the Z-axis direction in comparison to the mirror surface 22a.

The outer rib portion 224b is disposed on a surface of the frame portion 222 on the one side in the Z-axis direction. The outer rib portion 224b surrounds the inner rib portion 224a and the mirror surface 22a when viewed from the Z-axis direction. For example, an outer edge of the outer rib portion 224b extends along an outer edge of the frame portion 222 with a predetermined gap from the outer edge of the frame portion 222 when viewed from the Z-axis direction. An inner edge of the outer rib portion 224b extends along an inner edge of the frame portion 222 with a predetermined gap from the inner edge of the frame portion 222 when viewed from the Z-axis direction. An end surface 224bs of the outer rib portion 224b on the one side in the Z-axis direction is located on the one side in the Z-axis direction in comparison to the mirror surface 22a.

The pair of connection rib portions 224c are respectively disposed on surfaces of the pair of connection portions 223 on the one side in the Z-axis direction. The connection rib portions 224c connect the inner rib portion 224a and the outer rib portion 224b to each other. End surfaces 224cs of the connection rib portions 224c on the one side in the Z-axis direction are located on the one side in the Z-axis direction in comparison to the mirror surface 22a.

The thickness of the inner rib portion 224a, the thickness of the outer rib portion 224b, and the thickness of the respective connection rib portions 224c in the Z-axis direction are the same as each other. That is, the thickness of the support layer 101 that constitutes the inner rib portion 224a, the outer rib portion 224b, and the respective connection rib portions 224c is the same in each case. The end surface 224as of the inner rib portion 224a, the end surface 224bs of the outer rib portion 224b, and the end surfaces 224cs of the respective connection rib portions 224c are located on the same plane perpendicular to the Z-axis direction. The support layer 101 that constitutes the inner rib portion 224a, the outer rib portion 224b, and the respective connection rib portions 224c is thinner than the support layer 101 that constitutes the base 21. Accordingly, the end surfaces 224as, 224bs, and 224cs are located on the one side in the Z-axis direction in comparison to the first surface 21a of the base 21. In other words, the first surface 21a is located on the other side in the Z-axis direction in comparison to the end surfaces 224as, 224bs, and 224cs.

When viewed from the Z-axis direction, a width of the outer rib portion 224b is wider than a width of the inner rib portion 224a. The width of the inner rib portion 224a when viewed from the Z-axis direction is a length of the inner rib portion 224a in a direction perpendicular to the extending direction of the inner rib portion 224a, and is a length of the inner rib portion 224a in a radial direction of the inner rib portion 224a in this embodiment. This is also true of a width of the outer rib portion 224b when viewed from the Z-axis direction. A width of each of the connection rib portions 224c is wider than the width of each of the inner rib portion 224a and the outer rib portion 224b. The width of each of the connection rib portion 224c is a length of each of the connection rib portion 224c along the extending direction of the inner rib portion 224a.

The drive unit 23 includes a first elastic support unit 26, a second elastic support unit 27, and an actuator unit 28. The first elastic support unit 26, the second elastic support unit 27, and the actuator unit 28 are constituted by a part of the device layer 102.

Each of the first elastic support unit 26 and the second elastic support unit 27 is connected to between the base 21 and the movable mirror 22. The first elastic support unit 26 and the second elastic support unit 27 support the movable mirror 22 so that the movable mirror 22 (movable unit 22b) can move in the Z-axis direction.

The first elastic support unit 26 includes a pair of levers 261, a first link member 262, a second link member 263, a pair of beam members 264, an intermediate member 265, a pair of first torsion bars (first torsion support portions) 266, a pair of second torsion bars (second torsion support portions) 267, a pair of non-linearity mitigation springs 268, and a plurality of electrode support portions 269.

The pair of levers 261 are respectively disposed on both sides of the light passage portion 24 in the Y-axis direction, and face each other in the Y-axis direction. Each of the levers 261 has a plate shape that extends along a plane perpendicular to the Z-axis direction. The lever 261 includes a first portion 261a, a second portion 261b that is disposed on a side opposite to the movable mirror 22 with respect to the first portion 261a, and a third portion 261c that is connected to the first portion 261a and the second portion 261b. The first portion 261a and the second portion 261b extend in the X-axis direction. A length of the first portion 261a in the X-axis direction is shorter than a length of the second portion 261b in the X-axis direction. The third portions 261c of the pair of levers 261 obliquely extend to be spaced away from each other as going away from the movable mirror 22.

The first link member 262 bridges first ends 261d of the pair of levers 261 on a side opposite to the movable mirror 22. The first link member 262 has a plate shape that extends along a plane perpendicular to the Z-axis direction, and extends in the Y-axis direction. The second link member 263 bridges second ends 261e of the pair of levers 261 on the movable mirror 22 side. The second link member 263 has a plate shape that extends along a plane perpendicular to the Z-axis direction, and extends in the Y-axis direction. A width of the second link member 263 in the X-axis direction is narrower than a width of the first link member 262 in the X-axis direction. A length of the second link member 263 in the Y-axis direction is shorter than a length of the first link member 262 in the Y-axis direction.

The pair of beam members 264 respectively bridge the second portions 261b of the pair of levers 261 and the first link member 262. The respective beam members 264 have a plate shape that extends along a plane perpendicular to the Z-axis direction. The pair of beam members 264 obliquely extend to approach each other as going away from the movable mirror 22. The pair of levers 261, the first link member 262, the second link member 263, and the pair of beam members 264 define the light passage portion 24. The light passage portion 24 has a polygonal shape when viewed from the Z-axis direction. For example, the light passage portion 24 is a cavity (hole).

Alternatively, a material having optical transparency with respect to the measurement light L0 and the laser light L10 may be disposed in the light passage portion 24.

The intermediate member 265 has a plate shape that extends along a plane perpendicular to the Z-axis direction, and extends in the Y-axis direction. The intermediate member 265 is disposed between the movable mirror 22 and the second link member 263 (in other words, between the movable mirror 22 and the light passage portion 24). The intermediate member 265 is connected to the movable mirror 22 through the non-linearity mitigation springs 268 as to be described later.

The pair of first torsion bars 266 respectively bridge the first end 261d of one lever 261 and the base 21, and the first end 261d of the other lever 261 and the base 21. That is, the pair of first torsion bars 266 are respectively connected between the pair of levers 261 and the base 21. The first torsion bars 266 extend in the Y-axis direction. The pair of first torsion bars 266 are disposed on the same central line parallel to the Y-axis direction. In this embodiment, the central line of the first torsion bars 266 and the central line of the first link member 262 are located on the same straight line. A protrusion 261f that protrudes outward in the Y-axis direction is provided in each of the first ends 261d of the levers 261, and each of the first torsion bars 266 is connected to the protrusion 261f.

The pair of second torsion bars 267 respectively bridge the second end 261e of one lever 261 and one end of the intermediate member 265, and the second end 261e of the other lever 261 and the other end of the intermediate member 265. That is, the pair of second torsion bars 267 are respectively connected between the pair of levers 261 and the movable mirror 22. The respective second torsion bars 267 extend in the Y-axis direction. The pair of second torsion bars 267 are disposed on the same central line parallel to the Y-axis direction.

The pair of non-linearity mitigation springs 268 are connected between the movable mirror 22 and the intermediate member 265. That is, the pair of non-linearity mitigation springs 268 are connected between the movable mirror 22 and the second torsion bar 267. Each of the non-linearity mitigation springs 268 includes a meandering portion 268a that extends in a meandering manner when viewed from the Z-axis direction. The meandering portion 268a includes a plurality of straight portions 268b which extend in the Y-axis direction and are aligned in the X-axis direction, and a plurality of folded portions 268c which alternately connect both ends of the plurality of straight portions 268b. One end of the meandering portion 268a is connected to the intermediate member 265, and the other end of the meandering portion 268a is connected to the frame portion 222. In the meandering portion 268a, a portion on the frame portion 222 side has a shape along the outer edge of the frame portion 222.

The non-linearity mitigation spring 268 is constituted as follows. In a state in which the movable mirror 22 has moved in the Z-axis direction, the amount of deformation of the non-linearity mitigation spring 268 around the Y-axis direction becomes smaller than the amount of deformation of each of the first torsion bar 266 and the second torsion bar 267 around the Y-axis direction, and the amount of deformation of the non-linearity mitigation spring 268 in the X-axis direction becomes larger than the amount of deformation of each of the first torsion bar 266 and the second torsion bar 267 in the X-axis direction. Accordingly, it is possible to suppress occurrence of non-linearity in twist deformation of the first torsion bar 266 and the second torsion bar 267, and it is possible to suppress deterioration of control characteristics of the movable mirror 22 due to the non-linearity. The amount of deformation of the first torsion bar 266, the second torsion bar 267, and the non-linearity mitigation spring 268 around the Y-axis direction represents, for example, an absolute value of a twist amount (twist angle). The amount of deformation of the first torsion bar 266, the second torsion bar 267, and the non-linearity mitigation spring 268 in the X-axis direction represents, for example, an absolute value of a deflection amount. The amount of deformation of a member around the Y-axis direction represents the amount of deformation of the member in a peripheral direction of a circle of which the center is set to an axial line that passes through the center of the member and is parallel to the Y-axis. This is also true of first torsion bars 276, second torsion bars 277, and a non-linearity mitigation spring 278 to be described later.

The plurality of electrode support portions 269 include a pair of first electrode support portions 269a, a pair of second electrode support portions 269b, and a pair of third electrode support portions 269c. Each of the electrode support portions 269a, 269b, and 269c has a plate shape that extends along a plane perpendicular to the Z-axis direction, and extends in the Y-axis direction. Each of the electrode support portions 269a, 269b, and 269c extends from the second portion 261b of the lever 261 toward a side opposite to the light passage portion 24. The pair of first electrode support portions 269a are disposed on the same central line parallel to the Y-axis direction. The pair of second electrode support portions 269b are disposed on the same central line parallel to the Y-axis direction. The pair of third electrode support portions 269c are disposed on the same central line parallel to the Y-axis direction. In the X-axis direction, the first electrode support portions 269a, the second electrode support portions 269b, and the third electrode support portions 269c are aligned in this order from the movable mirror 22 side.

The second elastic support unit 27 includes a pair of levers 271, a first link member 272, a second link member 273, a pair of beam members 274, an intermediate member 275, a pair of first torsion bars (first torsion support portions) 276, a pair of second torsion bars (second torsion support portions) 277, a pair of non-linearity mitigation springs 278, and a plurality of electrode support portions 279.

The pair of levers 271 are respectively disposed on both sides of the light passage portion 25 in the Y-axis direction, and face each other in the Y-axis direction. Each of the levers 271 has a plate shape that extends along a plane perpendicular to the Z-axis direction. The lever 271 includes a first portion 271a, a second portion 271b that is disposed on a side opposite to the movable mirror 22 with respect to the first portion 271a, and a third portion 271c that is connected to the first portion 271a and the second portion 271b. The first portion 271a and the second portion 271b extend in the X-axis direction. A length of the first portion 271a in the X-axis direction is shorter than a length of the second portion 271b in the X-axis direction. The third portions 271c of the pair of levers 271 obliquely extend to be spaced away from each other as going away from the movable mirror 22.

The first link member 272 bridges first ends 271d of the pair of levers 271 on a side opposite to the movable mirror 22. The first link member 272 has a plate shape that extends along a plane perpendicular to the Z-axis direction, and extends in the Y-axis direction. The second link member 273 bridges second ends 271e of the pair of levers 271 on the movable mirror 22 side. The second link member 273 has a plate shape that extends along a plane perpendicular to the Z-axis direction, and extends in the Y-axis direction. A width of the second link member 273 in the X-axis direction is narrower than a width of the first link member 272 in the X-axis direction. A length of the second link member 273 in the Y-axis direction is shorter than a length of the first link member 272 in the Y-axis direction.

The pair of beam members 274 respectively bridge the second portions 271b of the pair of levers 271 and the first link member 272. The respective beam members 274 have a plate shape that extends along a plane perpendicular to the Z-axis direction. The pair of beam members 274 obliquely extend to approach each other as going away from the movable mirror 22. The pair of levers 271, the first link member 272, the second link member 273, and the pair of beam members 274 define the light passage portion 25. The light passage portion 25 has a polygonal shape when viewed from the Z-axis direction. For example, the light passage portion 25 is a cavity (hole). Alternatively, a material having optical transparency with respect to the measurement light L0 and the laser light L10 may be disposed in the light passage portion 25.

The intermediate member 275 has a plate shape that extends along a plane perpendicular to the Z-axis direction, and extends in the Y-axis direction. The intermediate member 275 is disposed between the movable mirror 22 and the second link member 273 (in other words, between the movable mirror 22 and the light passage portion 25). The intermediate member 275 is connected to the movable mirror 22 through the non-linearity mitigation springs 278 as to be described later.

The pair of first torsion bars 276 respectively bridge the first end 271d of one lever 271 and the base 21, and the first end 271d of the other lever 271 and the base 21. That is, the pair of first torsion bars 276 are respectively connected between the pair of levers 271 and the base 21. The first torsion bars 276 extend in the Y-axis direction. The pair of first torsion bars 276 are disposed on the same central line parallel to the Y-axis direction. In this embodiment, the central line of the first torsion bars 276 and the central line of the first link member 272 are located on the same straight line. A protrusion 271f that protrudes outward in the Y-axis direction is provided in each of the first ends 271d of the levers 271, and each of the first torsion bars 276 is connected to the protrusion 271f.

The pair of second torsion bars 277 respectively bridge the second end 271e of one lever 271 and one end of the intermediate member 275, and the second end 271e of the other lever 271 and the other end of the intermediate member 275. That is, the pair of second torsion bars 277 are respectively connected between the pair of levers 271 and the movable mirror 22. The respective second torsion bars 277 extend in the Y-axis direction. The pair of second torsion bars 277 are disposed on the same central line parallel to the Y-axis direction.

The pair of non-linearity mitigation springs 278 are connected between the movable mirror 22 and the intermediate member 275. That is, the pair of non-linearity mitigation springs 278 are connected between the movable mirror 22 and the second torsion bar 277. Each of the non-linearity mitigation springs 278 includes a meandering portion 278a that extends in a meandering manner when viewed from the Z-axis direction. The meandering portion 278a includes a plurality of straight portions 278b which extend in the Y-axis direction and are aligned in the X-axis direction, and a plurality of folded portions 278c which alternately connect both ends of the plurality of straight portions 278b. One end of the meandering portion 278a is connected to the intermediate member 275, and the other end of the meandering portion 278a is connected to the frame portion 222. In the meandering portion 278a, a portion on the frame portion 222 side has a shape along the outer edge of the frame portion 222.

The non-linearity mitigation spring 278 is constituted as follows. In a state in which the movable mirror 22 has moved in the Z-axis direction, the amount of deformation of the non-linearity mitigation spring 278 around the Y-axis direction becomes smaller than the amount of deformation of each of the first torsion bar 276 and the second torsion bar 277 around the Y-axis direction, and the amount of deformation of the non-linearity mitigation spring 278 in the X-axis direction becomes larger than the amount of deformation of each of the first torsion bar 276 and the second torsion bar 277 in the X-axis direction. Accordingly, it is possible to suppress occurrence of non-linearity in twist deformation of the first torsion bar 276 and the second torsion bar 277, and it is possible to suppress deterioration of control characteristics of the movable mirror 22 due to the non-linearity.

The plurality of electrode support portions 279 includes a pair of first electrode support portions 279a, a pair of second electrode support portions 279b, and a pair of third electrode support portions 279c. Each of the electrode support portions 279a, 279b, and 279c has a plate shape that extends along a plane perpendicular to the Z-axis direction, and extends in the Y-axis direction. Each of the electrode support portions 279a, 279b, and 279c extends from the second portion 271b of the lever 271 toward a side opposite to the light passage portion 25. The pair of first electrode support portions 279a are disposed on the same central line parallel to the Y-axis direction. The pair of second electrode support portions 279b are disposed on the same central line parallel to the Y-axis direction. The pair of third electrode support portions 279c are disposed on the same central line parallel to the Y-axis direction. In the X-axis direction, the first electrode support portions 279a, the second electrode support portions 279b, and the third electrode support portions 279c are aligned in this order from the movable mirror 22 side.

The actuator unit 28 moves the movable mirror 22 in the Z-axis direction. The actuator unit 28 includes a fixed comb electrode 281, a movable comb electrode 282, a fixed comb electrode 283, and a movable comb electrode 284. Positions of the fixed comb electrodes 281 and 283 are fixed. The movable comb electrodes 282 and 284 move in accordance with movement of the movable mirror 22.

The fixed comb electrode 281 is provided on a part of a surface, which faces the electrode support portions 269, of the device layer 102 of the base 21. The fixed comb electrode 281 includes a plurality of fixed comb fingers 281a which extend along a plane perpendicular to the Y-axis direction. The fixed comb fingers 281a are aligned in the Y-axis direction with a predetermined gap therebetween.

The movable comb electrode 282 is provided on a surface of each of the first electrode support portions 269a on the movable mirror 22 side, on surfaces of each of the second electrode support portions 269b on both sides in the X-axis direction, and on a surface of each of the third electrode support portion 269c on the movable mirror 22 side. The movable comb electrode 282 includes a plurality of movable comb fingers 282a which extend along a plane perpendicular to the Y-axis direction. The movable comb fingers 282a are aligned in the Y-axis direction with a predetermined gap therebetween.

In the fixed comb electrode 281 and the movable comb electrode 282, the plurality of fixed comb fingers 281a and the plurality of movable comb fingers 282a are alternately arranged. That is, each of the fixed comb fingers 281a of the fixed comb electrode 281 is located between the movable comb fingers 282a of the movable comb electrode 282. The fixed comb fingers 281a and the movable comb fingers 282a, which are adjacent to each other, face each other in the Y-axis direction. A distance between the fixed comb finger 281a and the movable comb finger 282a, which are adjacent to each other, is approximately several μm.

The fixed comb electrode 283 is provided on a part of a surface, which faces the electrode support portions 279, of the device layer 102 of the base 21. The fixed comb electrode 283 includes a plurality of fixed comb fingers 283a which extend along a plane perpendicular to the Y-axis direction. The fixed comb fingers 283a are aligned in the Y-axis direction with a predetermined gap therebetween.

The movable comb electrode 284 is provided on a surface of each of the first electrode support portion 279a on the movable mirror 22 side, on surfaces of each of the second electrode support portions 279b on both sides in the X-axis direction, and on a surface of each of the third electrode support portion 279c on the movable mirror 22 side. The movable comb electrode 284 includes a plurality of movable comb fingers 284a which extend along a plane perpendicular to the Y-axis direction. The movable comb fingers 284a are aligned in the Y-axis direction with a predetermined gap therebetween.

In the fixed comb electrode 283 and the movable comb electrode 284, the plurality of fixed comb fingers 283a and the plurality of movable comb fingers 284a are alternately arranged. That is, each of the fixed comb fingers 283a of the fixed comb electrode 283 is located between the movable comb fingers 284a of the movable comb electrode 284. The fixed comb fingers 283a and the movable comb fingers 284a, which are adjacent to each other, face each other in the Y-axis direction. For example, a distance between the fixed comb finger 283a and the movable comb finger 284a, which are adjacent to each other, is approximately several μm.

A plurality of electrode pads 211 are provided in the base 21. The electrode pads 211 are disposed on a surface of the device layer 102 in an opening 213 formed in the first surface 21a of the base 21 to reach the device layer 102. Some of the plurality of electrode pads 211 are electrically connected to the fixed comb electrode 281 or the fixed comb electrode 283 via the device layer 102. Several other electrode pads 211 among the plurality of electrode pads 211 are electrically connected to the movable comb electrode 282 or the movable comb electrode 284 via the first elastic support unit 26 or the second elastic support unit 27. In addition, a pair of electrode pads 212 which can be used as ground electrodes are provided in the base 21. The pair of electrode pads 212 are disposed on the first surface 21a to be located on both sides of the movable mirror 22 in the Y-axis direction.

In the mirror device 20 configured as described above, an electric signal for moving the movable mirror 22 in the Z-axis direction, is input to the drive unit 23 through a lead pin 113 to be described later and a wire (not illustrated). Accordingly, for example, an electrostatic force is generated between the fixed comb electrode 281 and the movable comb electrode 282 which face each other, and the fixed comb electrode 283 and the movable comb electrode 284 which face each other so that the movable mirror 22 moves to one side in the Z-axis direction. At this time, the first torsion bars 266 and 276 and the second torsion bars 267 and 277 in the first elastic support unit 26 and the second elastic support unit 27 are twisted, and an elastic force is generated in the first elastic support unit 26 and the second elastic support unit 27. In the mirror device 20, when a periodic electric signal is applied to the drive unit 23, it is possible to reciprocate the movable mirror 22 in the Z-axis direction at a resonance frequency level. In this manner, the drive unit 23 functions as an electrostatic actuator.

As illustrated in FIG. 2, FIG. 3, FIG. 4, and FIG. 7, the optical function member 13 includes the third surface 13a (a surface on the one side in the Z-axis direction) that faces the second surface 21b of the base 21, and a fourth surface 13b opposite to the third surface 13a. When viewed from the Z-axis direction, an outer edge 13c of the optical function member 13 is located outside of an outer edge 21c of the base 21. That is, when viewed from the Z-axis direction, the outer edge 13c of the optical function member 13 surrounds the outer edge 21c of the base 21. The optical function member 13 is integrally formed by a material having transparency with respect to the measurement light L0 and the laser light L10. For example, the optical function member 13 is formed in a rectangular plate shape by glass, and has a size of approximately 15 mm×20 mm×4 mm (thickness). For example, the material of the optical function member 13 is selected in accordance with a sensitivity wavelength of the optical module 1. For example, the material is set to glass in a case where the sensitivity wavelength of the optical module 1 is a near infrared region, and the material is set to silicon in a case where the sensitivity wavelength of the optical module 1 is an intermediate infrared region.

A pair of light transmitting portions 14 and 15 are provided in the optical function member 13. The light transmitting portion 14 is a portion, which faces the light passage portion 24 of the mirror device 20 in the Z-axis direction, in the optical function member 13. The light transmitting portion 15 is a portion, which faces the light passage portion 25 of the mirror device 20 in the Z-axis direction, in the optical function member 13. A surface 14a of the light transmitting portion 14 on the mirror device 20 side, and a surface 15a of the light transmitting portion 15 on the mirror device 20 side are located on the same plane as the third surface 13a. The light transmitting portion 14 constitutes a second portion of an optical path between the beam splitter unit 3 and the fixed mirror 16. The light transmitting portion 14 is a portion that corrects an optical path difference that occurs between an optical path between the beam splitter unit 3 and the movable mirror 22, and an optical path between the beam splitter unit 3 and the fixed mirror 16. In this embodiment, the light transmitting portion 15 does not function as a light transmitting portion.

The optical function member 13 includes a fifth surface 13d that faces the movable mirror 22 and the drive unit 23 of the mirror device 20. The fifth surface 13d is located on the fourth surface 13b side in comparison to the third surface 13a. The fifth surface 13d extends to the outer edge 13c of the optical function member 13 when viewed from the Z-axis direction. In this embodiment, the fifth surface 13d extends to a pair of opposite sides which extend in the Y-axis direction (a direction that intersects the first direction and the second direction) in the outer edge 13c of the optical function member 13 while surrounding ends of the respective light transmitting portions 14 and 15 on the mirror device 20 side.

The third surface 13a of the optical function member 13 is joined to the second surface 21b of the base 21 by direct bonding (for example, plasma activation bonding, surface-activated room-temperature bonding (SAB), atomic diffusion bonding (ADB), anodic bonding, fusion bonding, hydrophilic bonding, and the like). In this embodiment, the third surface 13a extends to face a plurality of the electrode pads 211 and 212 provided in the base 21 on both sides of the fifth surface 13d in the Y-axis direction. Here, the fifth surface 13d is located on the fourth surface 13b side in comparison to the third surface 13a, and thus the fifth surface 13d is separated from the mirror device 20 in a region where the fifth surface 13d faces the movable mirror 22 and the drive unit 23. In addition, the surface 14a of the light transmitting portion 14 and the surface 15a of the light transmitting portion 15 respectively face the light passage portions 24 and 25 of the mirror device 20. Accordingly, in the mirror unit 2, when the movable mirror 22 reciprocates in the Z-axis direction, the movable mirror 22 and the drive unit 23 are prevented from coming into contact with the optical function member 13.

A sixth surface 21d, which is separated from the optical function member 13 in a state in which the third surface 13a of the optical function member 13 and the second surface 21b of the base 21 are joined to each other, is provided in the base 21 of the mirror device 20. The sixth surface 21d is separated from the optical function member 13 in a region that includes at least a part of an outer edge of the base 21 when viewed from the Z-axis direction. In this embodiment, the sixth surface 21d is formed by removing the device layer 102 and the intermediate layer 103 along one side, which extends in the Y-axis direction, in the outer edge of the base 21 by etching. In addition, a plurality of reference holes 13e are formed in the third surface 13a of the optical function member 13. In this embodiment, the plurality of reference holes 13e are formed in the third surface 13a to correspond to a plurality of corners of the base 21. When the third surface 13a of the optical function member 13 and the second surface 21b of the base 21 are joined to each other, handling of the mirror device 20 is performed in a state in which a portion of the base 21 which corresponds to the sixth surface 21d is gripped, and thus a position of the mirror device 20 in the X-axis direction and the Y-axis direction, and an angle of the mirror device 20 in a plane perpendicular to the Z-axis direction are adjusted based on the plurality of reference holes 13e formed in the third surface 13a.

As illustrated in FIG. 3 and FIG. 4, the fixed mirror 16 is disposed on a side opposite to the mirror device 20 with respect to the optical function member 13, and a position of the mirror device 20 with respect to the base 21 is fixed. For example, the fixed mirror 16 is formed on the fourth surface 13b of the optical function member 13 by vapor deposition. The fixed mirror 16 includes a mirror surface 16a perpendicular to the Z-axis direction. In this embodiment, the mirror surface 22a of the movable mirror 22, and the mirror surface 16a of the fixed mirror 16 face one side (beam splitter unit 3 side) in the Z-axis direction. The fixed mirror 16 is formed continuously with the fourth surface 13b of the optical function member 13 to reflect light that is transmitted through the respective light transmitting portions 14 and 15 of the optical function member 13. However, a fixed mirror that reflects light transmitted through the light transmitting portion 14, and a fixed mirror that reflects light transmitted through the light transmitting portion 15 may be provided, respectively.

The stress mitigation substrate 17 is attached to the fourth surface 13b of the optical function member 13 via the fixed mirror 16. For example, the stress mitigation substrate 17 is attached to the fixed mirror 16, for example, by an adhesive. When viewed from the Z-axis direction, an outer edge of the stress mitigation substrate 17 is located outside of the outer edge 13c of the optical function member 13. That is, when viewed from the Z-axis direction, the outer edge of the stress mitigation substrate 17 surrounds the outer edge 13c of the optical function member 13. A thermal expansion coefficient of the stress mitigation substrate 17 is closer to a thermal expansion coefficient of the base 21 of the mirror device 20 (more specifically, a thermal expansion coefficient of the support layer 101) in comparison to a thermal expansion coefficient of the optical function member 13. In addition, the thickness of the stress mitigation substrate 17 is closer to the thickness of the base 21 of the mirror device 20 in comparison to the thickness of the optical function member 13. For example, the stress mitigation substrate 17 is formed in a rectangular plate shape by silicon, and has a size of approximately 16 mm×21 mm×0.65 mm (thickness).

Figure 8:
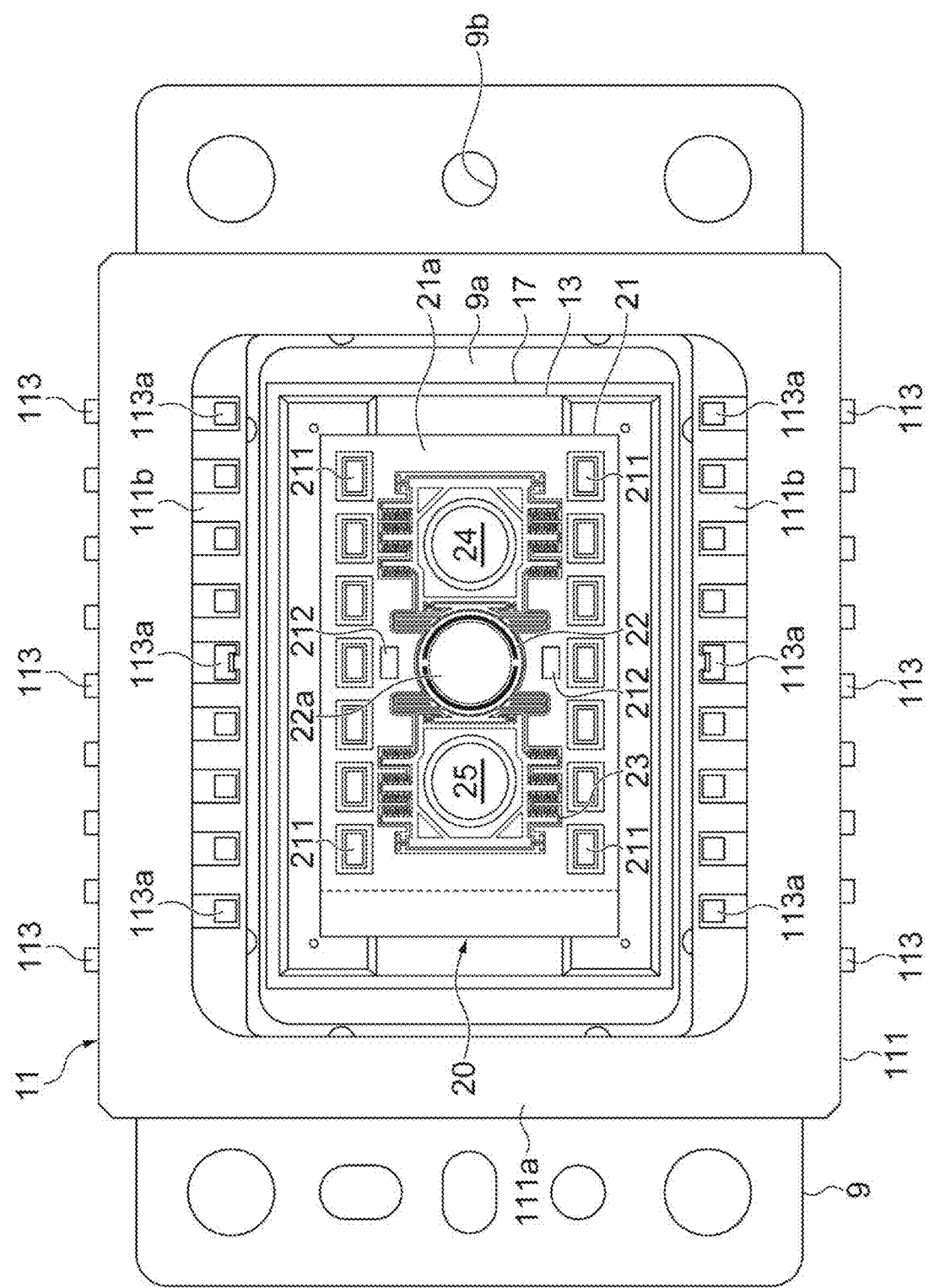
FIG. 8 is a cross-sectional view of the optical module which is taken along line VIII-VIII illustrated in FIG. 1.

As illustrated in FIG. 1, the mirror unit 2 configured as described above is attached to the support 9 by fixing a surface of the stress mitigation substrate 17 on a side opposite to the optical function member 13 to a surface 9a of the support 9 (surface on the one side in the Z-axis direction), for example, by an adhesive. When the mirror unit 2 is attached to the support 9, as illustrated in FIG. 8, a position of the mirror device 20 in the X-axis direction and the Y-axis direction and an angle of the mirror device 20 in a plane perpendicular to the Z-axis direction are adjusted based on a reference hole 9b that is formed in the support 9. In FIG. 8, the second support structure 12 is not illustrated.

[Configuration of First Support Structure and Beam Splitter Unit]

As illustrated in FIG. 1 and FIG. 8, the first support structure 11 includes a frame body 111, a light transmitting member 112, and a plurality of lead pins 113. The frame body 111 is formed so as to surround the mirror unit 2 when viewed from the Z-axis direction, and is attached to the surface 9a of the support 9, for example, by an adhesive such as silver solder. For example, the frame body 111 is formed of ceramic, and has a rectangular frame shape. An end surface 111a of the frame body 111 on a side opposite to the support 9 is located on a side opposite to the support 9 in comparison to the first surface 21a of the base 21 of the mirror device 20.

The light transmitting member 112 is formed so as to close an opening of the frame body 111, and is attached to the end surface 111a of the frame body 111, for example, with an adhesive. The light transmitting member 112 is formed of a material having transparency with respect to the measurement light L0 and the laser light L10, and has, for example, a rectangular plate shape. Here, the end surface 111a of the frame body 111 is located on a side opposite to the support 9 in comparison to the first surface 21a of the base 21 of the mirror device 20, and thus the light transmitting member 112 is separated from the mirror device 20. Accordingly, in the optical module 1A, when the movable mirror 22 reciprocates in the Z-axis direction, the movable mirror 22 and the drive unit 23 are prevented from coming into contact with the light transmitting member 112. In the optical module 1A, the support 9, the frame body 111, and the light transmitting member 112 constitute a package that accommodates the mirror unit 2.

The respective lead pins 113 are provided in the frame body 111 in such a manner that one end 113a is located inside of the frame body 111, and the other end (not illustrated) is located outside of the frame body 111. The one ends 113a of the lead pins 113 are electrically connected to the electrode pads 211 and 212 corresponding to the lead pins 113 in the mirror device 20 by wires (not illustrated). In the optical module 1A, an electric signal for moving the movable mirror 22 in the Z-axis direction is input to the drive unit 23 through the plurality of lead pins 113. In this embodiment, a stepped surface 111b that extends in the X-axis direction on both sides of the optical function member 13 in the Y-axis direction is formed in the frame body 111, and one end 113a of each of the lead pins 113 is disposed on the stepped surface 111b. The lead pin 113 extends in the Z-axis direction on both sides of the support 9 in the Y-axis direction, and the other end of the lead pin 113 is located on the other side in the Z-axis direction in comparison to the support 9.

Figure 10:
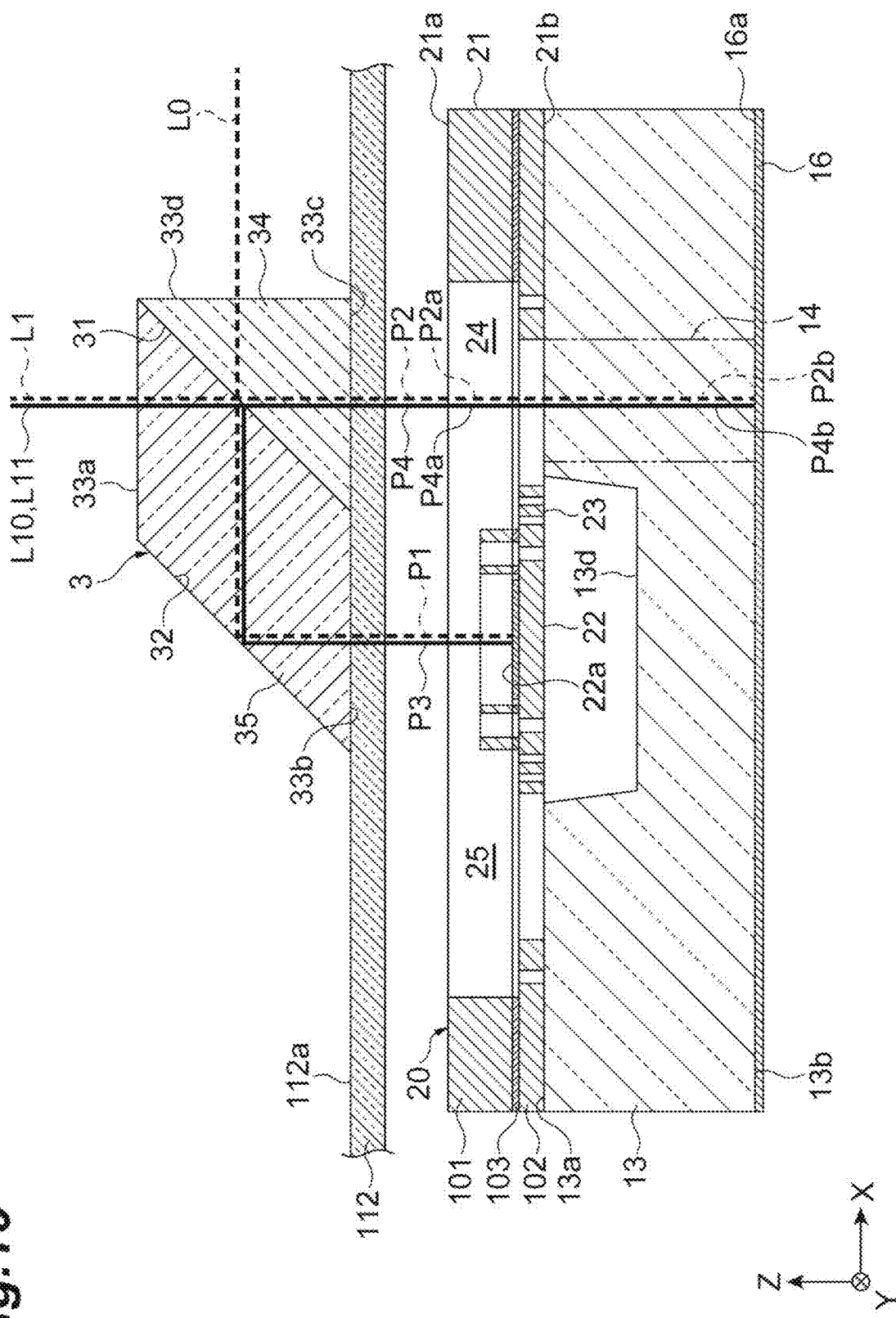
FIG. 10 is a schematic cross-sectional view of the mirror unit and a beam splitter unit which are illustrated in FIG. 1.

As illustrated in FIG. 10, the beam splitter unit 3 is attached to a surface 112a of the light transmitting member 112 on a side opposite to the mirror device 20, for example, by an optical adhesive that also functions as a refractive index matching agent. The beam splitter unit 3 includes a first mirror surface 31, a second mirror surface 32, and a plurality of optical surfaces 33a, 33b, 33c, and 33d. The beam splitter unit 3 is constituted by joining a plurality of optical blocks 34 and 35. The respective optical blocks 34 and 35 are formed of a material having a refractive index that is the same as or similar to that of the optical function member 13. FIG. 10 is a schematic cross-sectional view of the mirror unit 2 and the beam splitter unit 3 illustrated in FIG. 1, and in FIG. 10, the mirror device 20 is schematically illustrated, for example, in a state in which dimensions in the Z-axis direction are enlarged in comparison to actual dimensions.

The first mirror surface 31 is a mirror surface (for example, a half mirror surface) that is inclined with respect to the Z-axis direction, and is formed between the optical block 34 and the optical block 35. In this embodiment, the first mirror surface 31 is a surface that is parallel to the Y-axis direction, has an angle of 45° with respect to the Z-axis direction, and is inclined to be spaced away from the light incident unit 4 as it approaches the mirror device 20. The first mirror surface 31 has a function of reflecting a part of the measurement light L0 and allowing the remainder of the measurement light L0 to be transmitted therethrough, and a function of reflecting a part of the laser light L10 and allowing the remainder of the laser light L10 to be transmitted therethrough. For example, the first mirror surface 31 is formed of a dielectric multi-layer film. The first mirror surface 31 overlaps the light passage portion 24 of the mirror device 20, the light transmitting portion 14 of the optical function member 13, and the mirror surface 16a of the fixed mirror 16 when viewed from the Z-axis direction, and overlaps the light incident unit 4 when viewed form the X-axis direction (refer to FIG. 1). That is, the first mirror surface 31 faces the fixed mirror 16 in the Z-axis direction, and faces the light incident unit 4 in the X-axis direction.

The second mirror surface 32 is a mirror surface (for example, a total reflection mirror surface) that is parallel to the first mirror surface 31, and is formed in the optical block 35 to be located on a side opposite to the light incident unit 4 with respect to the first mirror surface 31. The second mirror surface 32 has a function of reflecting the measurement light L0 and a function of reflecting the laser light L10. For example, the second mirror surface 32 is formed of a metal film. The second mirror surface 32 overlaps the mirror surface 22a of the movable mirror 22 of the mirror device 20 when viewed from the Z-axis direction, and overlaps the first mirror surface 31 when viewed from the X-axis direction. That is, the second mirror surface 32 faces the movable mirror 22 in the Z-axis direction, and faces the first mirror surface 31 in the X-axis direction.

The optical surface 33a is a surface perpendicular to the Z-axis direction, and is formed in the optical block 35 to be located on a side opposite to the mirror device 20 with respect to the first mirror surface 31. The optical surface 33b is a surface perpendicular to the Z-axis direction, and is formed in the optical block 35 to be located on the mirror device 20 side with respect to the second mirror surface 32. The optical surface 33c is a surface perpendicular to the Z-axis direction, and is formed in the optical block 34 to be located on the mirror device 20 side with respect to the first mirror surface 31. The optical surface 33b and the optical surface 33c are located on the same plane. The optical surface 33d is a surface perpendicular to the X-axis direction, and is formed in the optical block 34 to be located on the light incident unit 4 side with respect to the first mirror surface 31. The respective optical surfaces 33a, 33b, 33c, and 33d have a function of allowing the measurement light L0 to be transmitted therethrough, and a function of allowing the laser light L10 to be transmitted therethrough.

Figure 9:
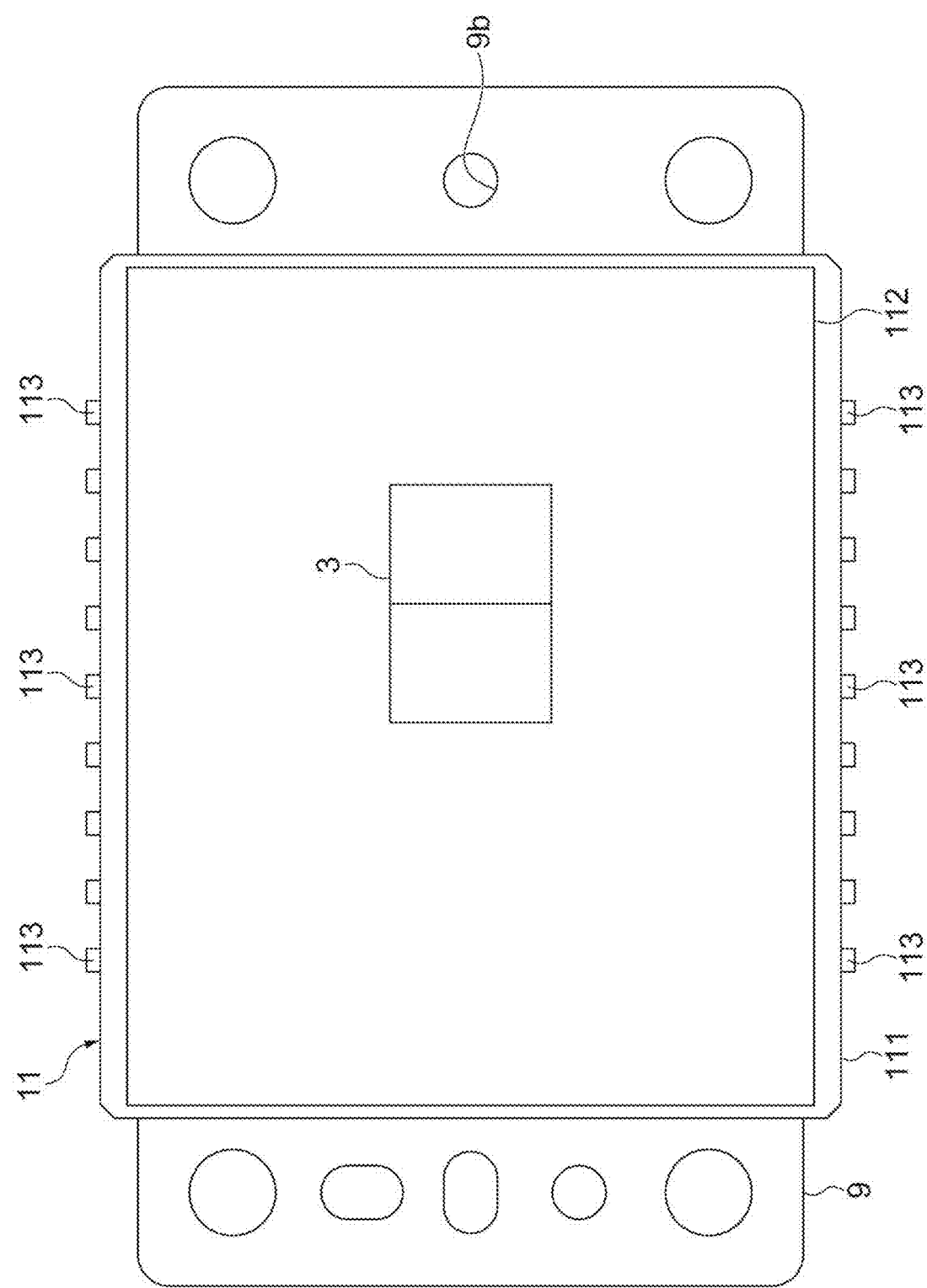
FIG. 9 is a cross-sectional view of the optical module which is taken along line IX-IX illustrated in FIG. 1.

The beam splitter unit 3 configured as described above is attached to the light transmitting member 112 by fixing the optical surface 33b and the optical surface 33c which are located on the same plane to the surface 112a of the light transmitting member 112, for example, by an optical adhesive. When the beam splitter unit 3 is attached to the light transmitting member 112, as illustrated in FIG. 9, a position of the beam splitter unit 3 in the X-axis direction and the Y-axis direction, and an angle of the beam splitter unit 3 in a plane perpendicular to the Z-axis direction are adjusted based on the reference hole 9b formed in the support 9. In FIG. 9, the second support structure 12 is not illustrated.

Here, the optical path of the measurement light L0 and the optical path of the laser light L10 in the mirror unit 2 and the beam splitter unit 3 will be described in detail with reference to FIG. 10.

As illustrated in FIG. 10, when the measurement light L0 is incident to the beam splitter unit 3 in the X-axis direction through the optical surface 33d, a part of the measurement light L0 is transmitted through the first mirror surface 31, is reflected by the second mirror surface 32, and reaches the mirror surface 22a of the movable mirror 22 through the optical surface 33b and the light transmitting member 112. The part of the measurement light L0 is reflected by the mirror surface 22a of the movable mirror 22, and proceeds on the same optical path P1 in an opposite direction, and is reflected by the first mirror surface 31. The remainder of the measurement light L0 is reflected by the first mirror surface 31, and reaches the mirror surface 16a of the fixed mirror 16 through the optical surface 33c, the light transmitting member 112, the light passage portion 24 of the mirror device 20, and the light transmitting portion 14 of the optical function member 13. The remainder of the measurement light L0 is reflected by the mirror surface 16a of the fixed mirror 16, proceeds on the same optical path P2 in an opposite direction, and is transmitted through the first mirror surface 31. The part of the measurement light L0 which is reflected by the first mirror surface 31, and the remainder of the measurement light L0 which is transmitted through the first mirror surface 31 become interference light L1, and the interference light L1 of the measurement light is emitted from the beam splitter unit 3 through the optical surface 33a along the Z-axis direction.

On the other hand, when the laser light L10 is incident to the beam splitter unit 3 in the Z-axis direction through the optical surface 33a, a part of the laser light L10 is reflected by the first mirror surface 31 and the second mirror surface 32, and reaches the mirror surface 22a of the movable mirror 22 through the optical surface 33b and the light transmitting member 112. The part of the laser light L10 is reflected by the mirror surface 22a of the movable mirror 22, proceeds on the same optical path P3 in an opposite direction, and is reflected by the first mirror surface 31. The remainder of the laser light L10 is transmitted through the first mirror surface 31, and reaches the mirror surface 16a of the fixed mirror 16 through the optical surface 33c, the light transmitting member 112, the light passage portion 24 of the mirror device 20, and the light transmitting portion 14 of the optical function member 13. The remainder of the laser light L10 is reflected by the mirror surface 16a of the fixed mirror 16, proceeds on the same optical path P4 in an opposite direction, and is transmitted through the first mirror surface 31. The part of the laser light L10 which is reflected by the first mirror surface 31, and the remainder of the laser light L10 which is transmitted through the first mirror surface 31 become interference light L11, and the interference light L11 of the laser light is emitted from the beam splitter unit 3 through the optical surface 33a along the Z-axis direction.

As described above, the light passage portion 24 of the mirror device 20 constitutes a first portion P2a of the optical path P2 of the measurement light L0 and a first portion P4a of the optical path P4 of the laser light L10 in an optical path between the beam splitter unit 3 and the fixed mirror 16. In addition, the light transmitting portion 14 of the optical function member 13 constitutes a second portion P2b of the optical path P2 of the measurement light L0 and a second portion P4b of the optical path P4 of the laser light L10 in the optical path between the beam splitter unit 3 and the fixed mirror 16.

The second portion P2b of the optical path P2 of the measurement light L0 is constituted by the light transmitting portion 14, thus an optical path difference between both the optical paths P1 and P2 is corrected so that a difference between an optical path length (optical path length in consideration of a refractive index of respective media through which the optical path passes) of the optical path P1 of the measurement light L0, and an optical path length of the optical path P2 of the measurement light L0 decreases. Similarly, the second portion P4b of the optical path P4 of the laser light L10 is constituted by the light transmitting portion 14, thus an optical path difference between both the optical paths P3 and P4 is corrected so that a difference between an optical path length of the optical path P3 of the laser light L10 and an optical path length of the optical path P4 of the laser light L10 decreases. In this embodiment, a refractive index of the light transmitting portion 14 is the same as a refractive index of the respective optical blocks which constitute the beam splitter unit 3, and a distance between the first mirror surface 31 and the second mirror surface 32 in the X-axis direction is the same as the thickness of the light transmitting portion 14 in the Z-axis direction (that is, a distance between the surface 14a of the light transmitting portion 14 and the fourth surface 13b of the optical function member 13 in the Z-axis direction).

[Configuration of Second Support Structure, Light Incident Unit, and the Like]

As illustrated in FIG. 1, the second support structure 12 includes a connection unit 120. The connection unit 120 includes a main body portion 121, a frame body 122, and a fixing plate 123. The main body portion 121 includes a pair of side wall portions 124 and 125, and a ceiling wall portion 126. The pair of side wall portions 124 and 125 face each other in the X-axis direction. An opening 124a is formed in the side wall portion 124 on one side in the X-axis direction. The ceiling wall portion 126 faces the support 9 in the Z-axis direction. An opening 126a is formed in the ceiling wall portion 126. For example, the main body portion 121 is integrally formed of a metal. A plurality of positioning pins 121a are provided in the main body portion 121. The main body portion 121 is positioned with respect to the support 9 by inserting the positioning pins 121a into the reference hole 9b and the hole 9c which are formed in the support 9, and is attached to the support 9 in this state, for example, by a bolt.

The frame body 122 is disposed on a surface of the side wall portion 124 on a side opposite to the beam splitter unit 3. An opening of the frame body 122 faces the beam splitter unit 3 through the opening 124a of the side wall portion 124. The light incident unit 4 is disposed in the frame body 122. The fixing plate 123 is a member that fixes the light incident unit 4 disposed in the frame body 122 to the main body portion 121 (details will be described later).

The second support structure 12 further includes a holding unit 130. The holding unit 130 includes a main body portion 131, a frame body 132 and a fixing plate 133. The main body portion 131 is attached to a surface of the ceiling wall portion 126 which is opposite to the support 9. The main body portion 131 is positioned with respect to the main body portion 121 of the connection unit 120 by a plurality of positioning pins 131a, and is attached to the ceiling wall portion 126 in this state, for example, by a bolt. A concave portion 134 is formed in a surface of the main body portion 131 which is opposite to the support 9. A first light passage hole 135, a second light passage hole 136, and a third light passage hole 137 are formed in a bottom surface of the concave portion 134. The first light passage hole 135 is formed at a position that faces the first mirror surface 31 of the beam splitter unit 3 in the Z-axis direction. The second light passage hole 136 is formed on the other side of the first light passage hole 135 in the X-axis direction (that is, on a side opposite to the light incident unit 4). The third light passage hole 137 is formed on the other side of the second light passage hole 136 in the X-axis direction.

The frame body 132 is disposed on the bottom surface of the concave portion 134. An opening of the frame body 132 faces the third light passage hole 137. The second light source 7 is disposed in the frame body 132. The first light detector 6 is disposed on the bottom surface of the concave portion 134 in a state of facing the first light passage hole 135. The second light detector 8 is disposed on the bottom surface of the concave portion 134 in a state of facing the second light passage hole 136. The fixing plate 133 is a member that fixes the first light detector 6 and the second light detector 8 which are disposed on the bottom surface of the concave portion 134, and the second light source 7 that is disposed in the frame body 132 to the main body portion 131 (details will be described later).

The light incident unit 4 includes a holder 41 and a collimator lens 42. The holder 41 holds the collimator lens 42, and is configured so that an optical fiber (not illustrated) that guides the measurement light L0 can be connected to the holder 41. The collimator lens 42 collimates the measurement light L0 emitted from the optical fiber. When the optical fiber is connected to the holder 41, an optical axis of the optical fiber matches an optical axis of the collimator lens 42.

A flange portion 41a is provided in the holder 41. The flange portion 41a is disposed between the frame body 122 and the fixing plate 123. In this state, fixing plate 123 is attached to the side wall portion 124, for example, by a bolt, and the light incident unit 4 disposed in the frame body 122 is fixed to the main body portion 121. In this manner, the light incident unit 4 is disposed on one side of the beam splitter unit 3 in the X-axis direction, and is supported by the second support structure 12. The light incident unit 4 allows measurement light L0 that is incident from the first light source through a measurement target or measurement light L0 that is generated from the measurement target (in this embodiment, the measurement light L0 guided by the optical fiber) to be incident to the beam splitter unit 3.

A filter 54 is attached to the frame body 122. The filter 54 has a function of cutting off the laser light L10. The filter 54 is disposed in the opening 124a of the side wall portion 124 in a state of being inclined with respect to an optical axis of the light incident unit 4. The filter 54 closes the opening of the frame body 122 when viewed form the X-axis direction. In this manner, the filter 54 is disposed between the light incident unit 4 and the beam splitter unit 3, and is supported by the second support structure 12 in a state of being inclined with respect to an optical axis of the light incident unit 4. In this embodiment, an optical surface of the filter 54 is a surface that is parallel to the Z-axis direction and has an angle of 10° to 20° with respect to the Y-axis direction. The optical axis of the light incident unit 4 is parallel to the X-axis direction.

The first light detector 6 includes a holder 61, a light detection element 62, and a condensing lens 63. The holder 61 holds the light detection element 62 and the condensing lens 63. The light detection element 62 detects the interference light L1 of the measurement light. For example, the light detection element 62 is an InGaAs photodiode. The condensing lens 63 condenses the interference light L1 of the measurement light incident to the light detection element 62 to the light detection element 62. In the holder 61, an optical axis of the light detection element 62 and an optical axis of the condensing lens 63 match each other.

A flange portion 61a is provided in the holder 61. The flange portion 61a is disposed between the bottom surface of the concave portion 134 of the main body portion 131, and the fixing plate 133. In this state, the fixing plate 133 attached to the main body portion 131, for example, by a bolt, and thus the first light detector 6 disposed on the bottom surface of the concave portion 134 is fixed to the main body portion 131. In this manner, the first light detector 6 is disposed on one side of the beam splitter unit 3 in the Z-axis direction, and is supported by the second support structure 12. The first light detector 6 faces the first mirror surface 31 of the beam splitter unit 3 in the Z-axis direction. The first light detector 6 detects the interference light L1 of the measurement light emitted from the beam splitter unit 3.

The second light detector 8 includes a holder 81, a light detection element 82, and a condensing lens 83. The holder 81 holds the light detection element 82 and the condensing lens 83. The light detection element 82 detects the interference light L11 of the laser light. For example, the light detection element 82 is a Si photodiode. The condensing lens 83 condenses the interference light L11 of the laser light incident to the light detection element 82 to the light detection element 82. In the holder 81, an optical axis of the light detection element 82 and an optical axis of the condensing lens 83 match each other.

A flange portion 81a is provided in the holder 81. The flange portion 81a is disposed between the bottom surface of the concave portion 134 of the main body portion 131, and the fixing plate 133. In this state, the fixing plate 133 is attached to the main body portion 131, for example, by a bolt, and thus the second light detector 8 disposed on the bottom surface of the concave portion 134 is fixed to the main body portion 131. In this manner, the second light detector 8 is disposed on one side of the beam splitter unit 3 in the Z-axis direction, and is supported by the second support structure 12. The second light detector 8 detects the interference light L11 of the laser light emitted from the beam splitter unit 3.

The second light source 7 includes a holder 71, a light-emitting element 72, and a collimator lens 73. The holder 71 holds the light-emitting element 72 and the collimator lens 73. The light-emitting element 72 emits the laser light L10. For example, the light-emitting element 72 is a semiconductor laser such as a VCSEL. The collimator lens 73 collimates the laser light L10 emitted from the light-emitting element 72. In the holder 71, an optical axis of the light-emitting element 72 and an optical axis of the collimator lens 73 match each other.

A flange portion 71a is provided in the holder 71. The flange portion 71a is disposed between the frame body 132 and the fixing plate 133. In this state, the fixing plate 133 is attached to the main body portion 131, for example, by a bolt, and thus the second light source 7 disposed in the frame body 132 is fixed to the main body portion 131. In this manner, the second light source 7 is disposed on one side of the beam splitter unit 3 in the Z-axis direction, and is supported by the second support structure 12. The second light source 7 emits the laser light L10 that is to be incident to the beam splitter unit 3.

As described above, the holding unit 130 holds the first light detector 6, the second light detector 8, and the second light source 7 so that the first light detector (first optical device) 6, the second light detector (second optical device) 8, and the second light source (third optical device) 7 face the same side, and the first light detector 6, the second light detector 8, and the second light source 7 are aligned in this order. In this embodiment, on one side of the beam splitter unit 3 in the Z-axis direction, the holding unit 130 holds the first light detector 6, the second light detector 8, and the second light source 7 so that the first light detector 6, the second light detector 8, and the second light source 7 face the other side in the Z-axis direction (that is, the beam splitter unit 3 side). In addition, the holding unit 130 holds the first light detector 6, the second light detector 8, and the second light source 7 so that the first light detector 6, the second light detector 8, and the second light source 7 are aligned in this order from one side (that is, the light incident unit 4 side) in the X-axis direction.

A configuration in which the first light detector 6 faces an arbitrary side represents that a light-receiving surface of the light detection element 62 faces the arbitrary side (that is, the first light detector 6 is disposed to detect light incident from the arbitrary side). In this case, for example, lead pins of the light detection element 62 extend to a side opposite to the arbitrary side. Similarly, a configuration in which the second light detector 8 faces an arbitrary side represents that a light-receiving surface of the light detection element 82 faces the arbitrary side (that is, the second light detector 8 is disposed to detect light incident from the arbitrary side). In this case, for example, lead pins of the light detection element 82 extend to a side opposite to the arbitrary side. In addition, a configuration in which the second light source 7 faces an arbitrary side represents that a light emission surface of the light-emitting element 72 faces the arbitrary side (that is, the second light source 7 is disposed to emit light to the arbitrary side). In this case, for example, lead pins of the light-emitting element 72 extend to a side opposite to the arbitrary side. In addition, the holding unit 130 is a part of the second support structure 12. Accordingly, even though the holding unit 130 holds an arbitrary configuration, the arbitrary configuration represents that the arbitrary configuration is supported by the second support structure 12.

A first mirror 51, a second mirror 52, and a third mirror 53 are attached to the main body portion 131 of the holding unit 130. The first mirror 51 is held by the holding unit 130 to be located on a side opposite to the first light detector 6 with respect to the first light passage hole 135. The second mirror 52 is held by the holding unit 130 to be located on a side opposite to the second light detector 8 with respect to the second light passage hole 136. The third mirror 53 is held by the holding unit 130 to be located on a side opposite to the second light source 7 with respect to the third light passage hole 137.

The first mirror 51 is a dichroic mirror that has a function of allowing the measurement light L0 to be transmitted therethrough and of reflecting the laser light L10, and is inclined with respect to the optical axis of the first light detector 6. The first mirror 51 is disposed between the beam splitter unit 3 and the first light detector 6. That is, the first mirror 51 is disposed to face the beam splitter unit 3 and the first light detector 6. In this embodiment, an optical surface of the first mirror 51 is a surface that is parallel to the Y-axis direction and has an angle of 45° with respect to the Z-axis direction. The optical axis of the first light detector 6 is parallel to the Z-axis direction.

The second mirror 52 is a mirror (for example, a half mirror) that has a function of reflecting a part of the laser light L10 and allowing the remainder of the laser light L10 to be transmitted therethrough, and is parallel to the first mirror 51. The second mirror 52 is disposed to overlap the first mirror 51 when viewed from the X-axis direction, and to overlap the second light detector 8 when viewed from the Z-axis direction. That is, the second mirror 52 is disposed to face the first mirror 51 and the second light detector 8. In this embodiment, an optical surface of the second mirror 52 is a surface that is parallel to the Y-axis direction, and has an angle of 45° with respect to the Z-axis direction.

The third mirror 53 is a mirror (for example, a total reflection mirror) that has a function of reflecting the laser light L10 and is parallel to the second mirror 52. The third mirror 53 is disposed to overlap the second mirror 52 when viewed from the X-axis direction, and overlap the second light source 7 when viewed from the Z-axis direction. That is, the third mirror 53 is disposed to face the second mirror 52 and the second light source 7. In this embodiment, an optical surface of the third mirror 53 is a surface that is parallel to the Y-axis direction, and has an angle of 45° with respect to the Z-axis direction.

An aperture 55 is attached to the main body portion 131 of the holding unit 130. The aperture 55 is held by the holding unit 130 to be located between the first mirror 51 and the first light detector 6. The aperture 55 is a member in which an opening having a circular shape is formed when viewed from the Z-axis direction, and is disposed in the first light passage hole 135.

Here, description will be given of an optical path between the beam splitter unit 3 and the first light detector 6, and the like. The interference light L1 of the measurement light, which is emitted from the beam splitter unit 3 in the Z-axis direction, is transmitted through the first mirror 51, is incident to the first light detector 6 through the aperture 55, and is detected by the first light detector 6. On the other hand, the laser light L10 emitted from the second light source 7 is reflected by the third mirror 53, is transmitted through the second mirror 52, is reflected by the first mirror 51, and is incident to the beam splitter unit 3 in the Z-axis direction. The interference light L11 of the laser light, which is emitted from the beam splitter unit 3 in the Z-axis direction, is reflected by the first mirror 51 and the second mirror 52, is incident to the second light detector 8, and is detected by the second light detector 8.

In the optical module 1A, a length of an optical path between the beam splitter unit 3 and the first light detector 6 is shorter than a length of an optical path between the beam splitter unit 3 and the second light detector 8, and is shorter than a length of an optical path between the beam splitter unit 3 and the second light source 7. The lengths of the optical paths represent physical distances along the optical paths.

Specifically, a distance from an intersection between the optical path and the first mirror surface 31 of the beam splitter unit 3 to a light incident surface of the first light detector 6 is shorter than a distance from the intersection between the optical path and the first mirror surface 31 of the beam splitter unit 3 to a light incident surface of the second light detector 8, and is shorter than a distance from the intersection between the optical path and the first mirror surface 31 of the beam splitter unit 3 to a light emission surface of the second light source 7. A distance from the intersection between the optical path and the first mirror surface 31 of the beam splitter unit 3 to a light incident surface of the condensing lens 63 of the first light detector 6 is shorter than a distance from the intersection between the optical path and the first mirror surface 31 of the beam splitter unit 3 to a light incident surface of the condensing lens 83 of the second light detector 8, and is shorter than a distance from the intersection between the optical path and the first mirror surface 31 of the beam splitter unit 3 to a light emission surface of the collimator lens 73 of the second light source 7. A distance from the optical surface 33a of the beam splitter unit 3 to the light incident surface of the first light detector 6 is shorter than a distance from the optical surface 33a of the beam splitter unit 3 to the light incident surface of the second light detector 8, and is shorter than a distance from the optical surface 33a of the beam splitter unit 3 to the light emission surface of the second light source 7. A distance from the optical surface 33a of the beam splitter unit 3 to the light incident surface of the condensing lens 63 of the first light detector 6 is shorter than a distance from optical surface 33a of the beam splitter unit 3 to the light incident surface of the condensing lens 83 of the second light detector 8, and is shorter than a distance from the optical surface 33a of the beam splitter unit 3 to the light emission surface of the collimator lens 73 of the second light source 7.

In this embodiment, the light incident unit 4 has a configuration in which angle adjustment of the holder 41 with respect to the frame body 122 is possible. In contrast, the first light detector 6 is positioned by the main body portion 131 when the holder 61 is disposed on the bottom surface of the concave portion 134 of the main body portion 131. Accordingly, in a state in which the first light detector 6 is positioned, the angle adjustment of the holder 41 can be carried out so that detection intensity in the first light detector 6 becomes the maximum while the measurement light L0 is incident to the beam splitter unit 3. In addition, in a state in which the angle adjustment is carried out, the light incident unit 4 can be fixed to the frame body 122.

Similarly, the second light source 7 has a configuration in which angle adjustment of the holder 71 with respect to the frame body 132 is possible. In contrast, the second light detector 8 is positioned by the main body portion 131 when the holder 81 is disposed on the bottom surface of the concave portion 134 of the main body portion 131. Accordingly, in a state in which the second light detector 8 is positioned, the angle adjustment of the holder 71 can be carried out so that detection intensity in the second light detector 8 becomes the maximum while emitting the laser light L10. In addition, in a state in which the angle adjustment is carried out, the second light source 7 can be fixed to the frame body 132.

Not only the light incident unit 4 but also the first light detector 6 may have a configuration in which angle adjustment of the holder 61 with respect to the frame body disposed on the bottom surface of the concave portion 134 of the main body portion 131 is possible. Similarly, not only the second light source 7 but also the second light detector 8 may have a configuration in which angle adjustment of the holder 81 with respect to the frame body disposed on the bottom surface of the concave portion 134 of the main body portion 131 is possible.

[Operation and Effect]

In the optical module 1A, the first light detector 6, the second light detector 8, and the second light source 7 are held by the holding unit 130 to face the same side (in this embodiment, the other side in the Z-axis direction). Accordingly, it is possible to constitute the interference optical system relating to the measurement light L0 and the interference optical system relating to the laser light L10 with a simple layout, and it is possible to carry out spectral analysis based on a detection result of the interference light L1 of the measurement light while acquiring a position of the movable mirror 22 in the Z-axis direction based on a detection result of the interference light L11 of the laser light. In addition, lead pins from the first light detector 6, the second light detector 8, and the second light source 7 can be extended to the same side (in this embodiment, one side in the Z-axis direction), and thus it is possible to realize integration of a circuit substrate for signal input/output with respect to the first light detector 6, the second light detector 8, and the second light source 7. In addition, the first light detector 6, the second light detector 8, and the second light source 7 are held by the holding unit 130 to be aligned in this order, and the length of the optical path between the beam splitter unit 3 and the first light detector 6 is shorter than the length of the optical path between the beam splitter unit 3 and the second light detector 8, and is shorter than the length of the optical path between the beam splitter unit 3 and the second light source 7. According to this, it is possible to detect the interference light L1 of the measurement light with a sufficient light amount. As described above, according to the optical module 1A, it is possible to realize high-accuracy spectral analysis with a simple configuration.

In addition, in the optical module 1A, the first light detector 6, the second light detector 8, and the second light source 7 are held by the holding unit 130 in a state in which the first light detector 6 and the second light detector 8 are adjacent to each other. According to this, it is possible to realize simplification of a configuration of the circuit substrate for signal input/output with respect to the first light detector 6, the second light detector 8, and the second light source 7.

In addition, in the optical module 1A, the aperture 55 is disposed between the first mirror 51 and the first light detector 6, and is held by the holding unit 130. According to this, a deviation is less likely to occur in a mutual positional relationship of the aperture 55 and the first light detector 6. In addition, it is possible to realize higher accurate spectral analysis by cutting out an outer edge portion that may become a noise in the interference light L1 of the measurement light. In addition, it is possible to reduce a variation of a phase difference in a beam plane in the interference light L1 of the measurement light which is detected by the first light detector 6.

In addition, in the optical module 1A, the filter 54 having a function of cutting off the laser light L10 is disposed between the light incident unit 4 and the beam splitter unit 3, and is disposed in a state of being inclined with respect to the optical axis of the light incident unit 4. Accordingly, even when light in the same wavelength range as the laser light L10 is included in the measurement light L0, the light is prevented from being incident to the beam splitter unit 3, and thus it is possible to obtain a position of the movable mirror 22 in the Z-axis direction with accuracy based on a detection result of the interference light L11 of the laser light. In addition, since the filter 54 is inclined with respect to the optical axis of the light incident unit 4, light in the same wavelength range as the laser light L10 is reflected to the outside of an interference optical system, and thus it is possible to reliably prevent the light from being stray light. In this embodiment, light in the same wavelength range as the laser light L10 emitted from the beam splitter unit 3 in the X-axis direction is reflected by the filter 54, and is emitted to the outside of the interference optical system from between the pair of side wall portions 124 and 125 in the main body portion 121 of the second support structure 12. Accordingly, it is possible to reliably prevent the light from being stray light.

In addition, in the optical module 1A, the first mirror 51, the second mirror 52, and the third mirror 53 are held by the holding unit 130. Accordingly, it is possible to integrally handle the first light detector 6, the second light detector 8, and the second light source 7, and the first mirror 51, the second mirror 52, and the third mirror 53.

In addition, in the optical module 1A, the holding unit 130 may hold the first light detector 6, the second light detector 8, and the second light source 7 so that the first light detector 6, the second light detector 8, and the second light source 7 face the other side in the Z-axis direction on one side of the beam splitter unit 3 in the Z-axis direction. Accordingly, it is possible to realize a reduction in size of the optical module 1A in a direction that intersects the Z-axis direction.

Second Embodiment

Figure 11:
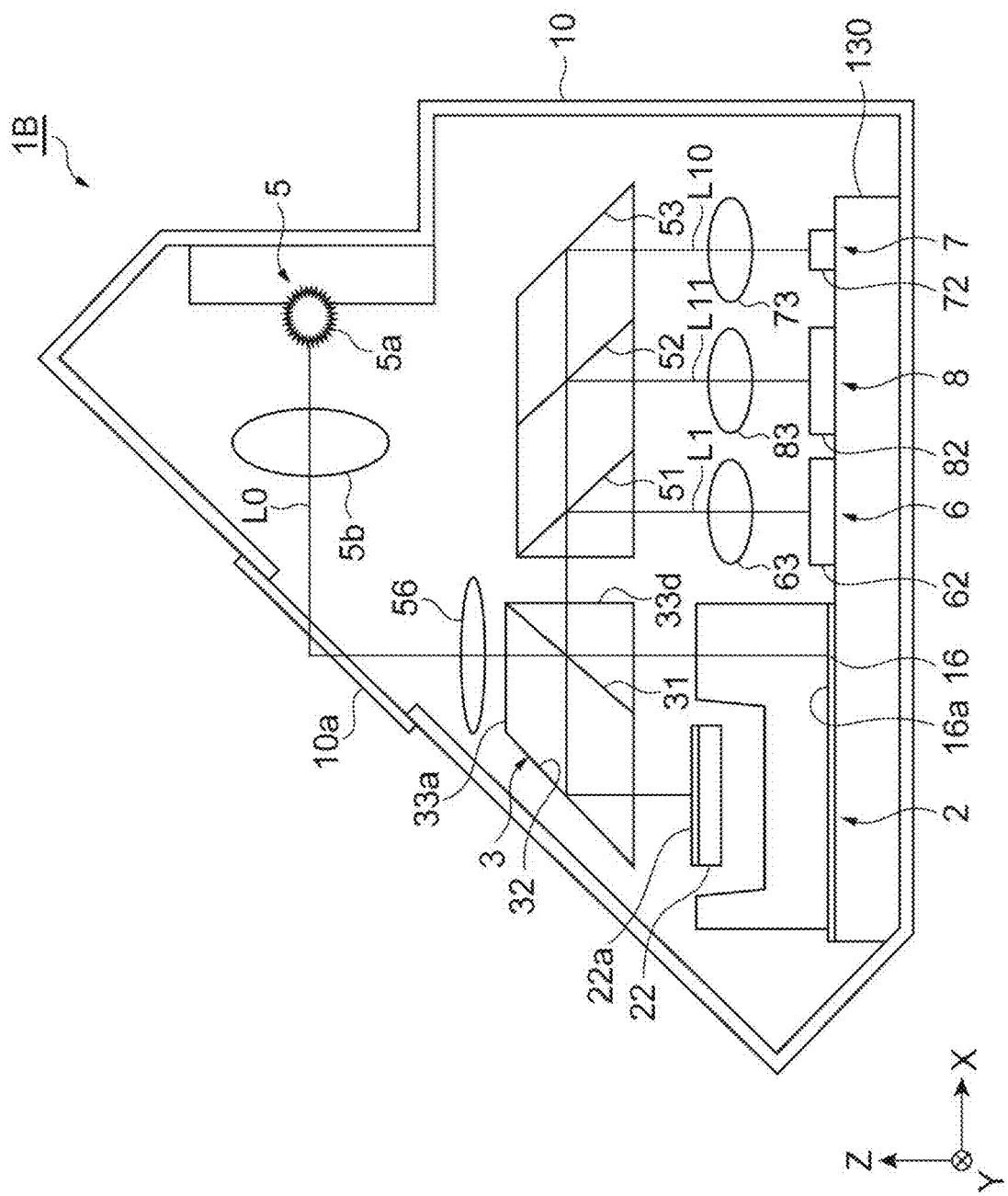
FIG. 11 is a schematic cross-sectional view of an optical module of a second embodiment.

As illustrated in FIG. 11, an optical module 1B includes a first light source 5 that emits measurement light L0. The first light source 5 includes a light-emitting element 5a and a condensing lens 5b. For example, the light-emitting element 5a is a heat type light source such as a filament. The condensing lens 5b condenses the measurement light L0.

The holding unit 130 holds the first light detector 6, the second light detector 8, and the second light source 7 so that the first light detector 6, the second light detector 8, and the second light source 7 face the one side in the Z-axis direction on one side of the mirror unit 2 in the X-axis direction, and the first light detector 6, the second light detector 8, and the second light source 7 are aligned in this order from the other side (that is, the mirror unit 2 side) in the X-axis direction.

The holding unit 130 holds a first mirror 51, a second mirror 52, and a third mirror 53 in addition to the first light detector 6, the second light detector 8, and the second light source 7. The first mirror 51, the second mirror 52, and the third mirror 53 are constituted by a plurality of optical blocks which are joined to each other.

The first mirror 51 is a dichroic mirror that has a function of reflecting the measurement light L0 and allowing the laser light L10 to be transmitted therethrough, and is inclined with respect to an optical axis of the first light detector 6. The first mirror 51 is disposed to overlap the beam splitter unit 3 when viewed from the X-axis direction and to overlap the first light detector 6 when viewed from the Z-axis direction. That is, the first mirror 51 is disposed to face the beam splitter unit 3 and the first light detector 6. In this embodiment, an optical surface of the first mirror 51 is a surface that is parallel to the Y-axis direction and has an angle of 45° with respect to the Z-axis direction. The optical axis of the first light detector 6 is parallel to the Z-axis direction.

The second mirror 52 is a mirror that has a function of reflecting a part of the laser light L10 and allowing the remainder of the laser light L10 to be transmitted therethrough, and is parallel to the first mirror 51. The second mirror 52 is disposed to overlap the first mirror 51 when viewed form the X-axis direction, and to overlap the second light detector 8 when viewed from the Z-axis direction. That is, the second mirror 52 is disposed to face the first mirror 51 and the second light detector 8. In this embodiment, an optical surface of the second mirror 52 is a surface that is parallel to the Y-axis direction and has an angle of 45° with respect to the Z-axis direction.

The third mirror 53 is a mirror that has a function of reflecting the laser light L10 and is parallel to the second mirror 52. The third mirror 53 is disposed to overlap the second mirror 52 when viewed from the X-axis direction, and to overlap the second light source 7 when viewed from the Z-axis direction. That is, the third mirror 53 is disposed to face the second mirror 52 and the second light source 7. In this embodiment, an optical surface of the third mirror 53 is a surface that is parallel to the Y-axis direction and has an angle of 45° with respect to the Z-axis direction.

In the optical module 1B, the measurement light L0 that is emitted from the first light source 5 along the X-axis direction is emitted to the outside of a housing 10 through a window portion 10a provided in the housing 10 and a measurement target (not illustrated) is irradiated with the measurement light L0. The measurement light L0 reflected from the measurement target is incident into the housing 10 through the window portion 10a and is collimated by a collimator lens 56. The collimated measurement light L0 is incident to the optical surface 33a of the beam splitter unit 3 along the Z-axis direction. As described above, in the optical module 1B, the window portion 10a functions as a light incident unit that allows the measurement light L0 incident from the first light source 5 through the measurement target to be incident to the beam splitter unit 3. The interference light L1 of the measurement light which is emitted from the optical surface 33d of the beam splitter unit 3 along the X-axis direction is reflected by the first mirror 51, is incident to the first light detector 6, and is detected by the first light detector 6.

On the other hand, the laser light L10 emitted from the second light source 7 is reflected by the third mirror 53, is transmitted through the second mirror 52 and the first mirror 51, and is incident to the optical surface 33d of the beam splitter unit 3 along the X-axis direction. Interference light L11 of the laser light which is emitted from the optical surface 33d of the beam splitter unit 3 along the X-axis direction is transmitted through the first mirror 51, is reflected by the second mirror 52, and is incident to the second light detector 8 and is detected by the second light detector 8.

Even in the optical module 1B, as in the above-described optical module 1A, a length of an optical path between the beam splitter unit 3 and the first light detector 6 is shorter than a length of an optical path between the beam splitter unit 3 and the second light detector 8, and is shorter than a length of an optical path between the beam splitter unit 3 and the second light source 7.

Specifically, a distance from an intersection between the optical path and the first mirror surface 31 of the beam splitter unit 3 to a light incident surface of the first light detector 6 is shorter than a distance from the intersection between the optical path and the first mirror surface 31 of the beam splitter unit 3 to a light incident surface of the second light detector 8, and is shorter than a distance from the intersection between the optical path and the first mirror surface 31 of the beam splitter unit 3 to a light emission surface of the second light source 7. A distance from the intersection between the optical path and the first mirror surface 31 of the beam splitter unit 3 to a light incident surface of the condensing lens 63 of the first light detector 6 is shorter than a distance from the intersection between the optical path and the first mirror surface 31 of the beam splitter unit 3 to a light incident surface of the condensing lens 83 of the second light detector 8, and is shorter than a distance from the intersection between the optical path and the first mirror surface 31 of the beam splitter unit 3 to a light emission surface of the collimator lens 73 of the second light source 7. A distance from the optical surface 33d of the beam splitter unit 3 to the light incident surface of the first light detector 6 is shorter than a distance from the optical surface 33d of the beam splitter unit 3 to the light incident surface of the second light detector 8, and is shorter than a distance from the optical surface 33d of the beam splitter unit 3 to the light emission surface of the second light source 7. A distance from the optical surface 33d of the beam splitter unit 3 to the light incident surface of the condensing lens 63 of the first light detector 6 is shorter than a distance from optical surface 33d of the beam splitter unit 3 to the light incident surface of the condensing lens 83 of the second light detector 8, and is shorter than a distance from the optical surface 33d of the beam splitter unit 3 to the light emission surface of the collimator lens 73 of the second light source 7.

According to the optical module 1B configured as described above, it is possible to realize high-accuracy spectral analysis with a simple configuration as in the above-described optical module 1A.

In addition, in the optical module 1B, the holding unit 130 holds the first light detector 6, the second light detector 8, and the second light source 7 so that the first light detector 6, the second light detector 8, and the second light source 7 face the one side in the Z-axis direction on one side of the mirror unit 2 in the X-axis direction. Accordingly, it is possible to realize a reduction in size of the optical module 1B in the Z-axis direction. In addition, it is possible to realize integration of a circuit substrate for signal input/output with respect to the mirror unit 2, the first light detector 6, the second light detector 8, and the second light source 7.

The optical module 1B may not be provided with the first light source 5, and may be provided with the light incident unit 4 to which an optical fiber is connected as in the above-described optical module 1A. In contrast, the above-described optical module 1A may not be provided with the light incident unit 4 to which the optical fiber is connected, and may be provided with the first light source 5, and the window portion 10a that functions as the light incident unit as in the optical module 1B. In addition, the first mirror 51, the second mirror 52, and the third mirror 53 of the optical module 1B may be constituted by a plurality of optical plates which are separated from each other as in the above-described optical module 1A. In contrast, the first mirror 51, the second mirror 52, and the third mirror 53 of the above-described optical module 1A may be constituted by a plurality of optical block which are joined to each other as in the optical module 1B.

Third Embodiment

Figure 12:
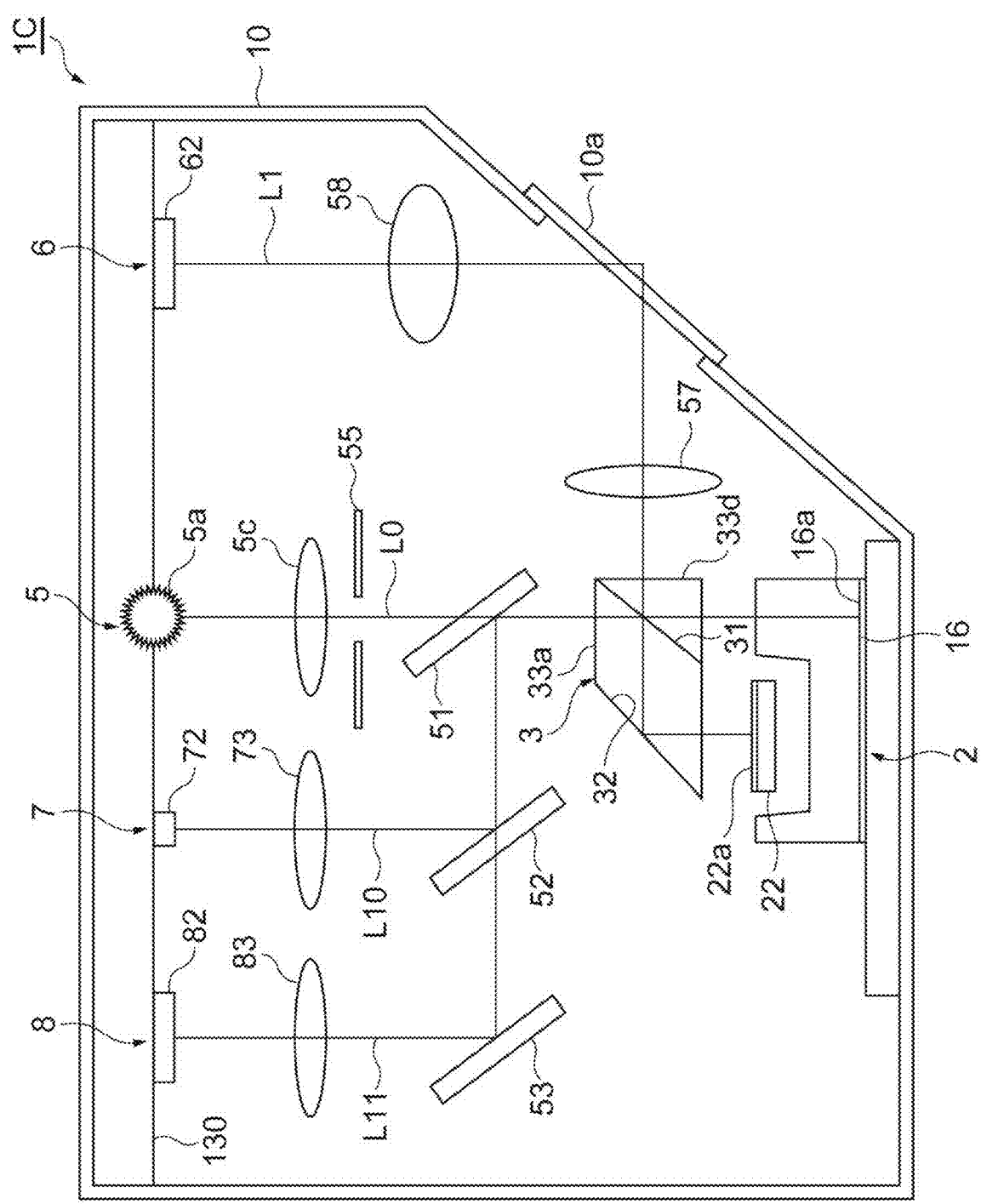
FIG. 12 is a schematic cross-sectional view of an optical module of a third embodiment.

As illustrated in FIG. 12, an optical module 1C includes a first light source 5 that emits the measurement light L0. The first light source 5 includes a light-emitting element 5a, and a collimator lens 5c. For example, the light-emitting element 5a is a heat type light source such as a filament. The collimator lens 5c collimates the measurement light L0.

The holding unit 130 holds the first light source 5, the second light source 7, and the second light detector 8 so that the first light source (first optical device) 5, the second light source 7, and the second light detector 8 face the other side (that is, the beam splitter unit 3 side) in the Z-axis direction on one side of the beam splitter unit 3 in the Z-axis direction, and the first light source 5, the second light source 7, and the second light detector 8 are aligned in this order from the one side in the X-axis direction.

The holding unit 130 holds a first mirror 51, a second mirror 52, and a third mirror 53 in addition to the first light source 5, the second light source 7, and the second light detector 8. The first mirror 51, the second mirror 52, and the third mirror 53 are constituted by a plurality of optical plates which are separated from each other.

The first mirror 51 is a dichroic mirror that has a function of allowing the measurement light L0 to be transmitted therethrough and reflecting the laser light L10, and is inclined with respect to an optical axis of the first light source 5. The first mirror 51 is disposed between the beam splitter unit 3 and the first light source 5. That is, the first mirror 51 is disposed to face the beam splitter unit 3 and the first light source 5. An aperture 55 that is held by the holding unit 130 is disposed between the first mirror 51 and the first light source 5. In this embodiment, an optical surface of the first mirror 51 is a surface that is parallel to the Y-axis direction and has an angle of 45° with respect to the Z-axis direction. The optical axis of the first light source 5 is parallel to the Z-axis direction.

The second mirror 52 is a mirror that has a function of reflecting a part of the laser light L10 and allowing the remainder of the laser light L10 to be transmitted therethrough and is parallel to the first mirror 51. The second mirror 52 is disposed to overlap the first mirror 51 when viewed from the X-axis direction and to overlap the second light source 7 when viewed from the Z-axis direction. That is, the second mirror 52 is disposed to face the first mirror 51 and the second light source 7. In this embodiment, an optical surface of the second mirror 52 is a surface that is parallel to the Y-axis direction and has an angle of 45° with respect to the Z-axis direction.

The third mirror 53 is a mirror that has a function of reflecting the laser light L10 and is parallel to the second mirror 52. The third mirror 53 is disposed to overlap the second mirror 52 when viewed from the X-axis direction and to overlap the second light detector 8 when viewed from the Z-axis direction. That is, the third mirror 53 is disposed to face the second mirror 52 and the second light detector 8. In this embodiment, an optical surface of the third mirror 53 is a surface that is parallel to the Y-axis direction and has an angle of 45° with respect to the Z-axis direction.

In the optical module 1C, the measurement light L0 that is emitted from the first light source 5 along the Z-axis direction is incident to the first mirror 51 through the aperture 55, is transmitted through the first mirror 51, and is incident to the optical surface 33a of the beam splitter unit 3 along the Z-axis direction. Interference light L1 of the measurement light which is emitted from the optical surface 33d of the beam splitter unit 3 along the X-axis direction is emitted to the outside of a housing 10 through a window portion 10a provided in the housing 10 while being condensed by a condensing lens 57, and a measurement target (not illustrated) is irradiated with the interference light L1. The interference light L1 of the measurement light which is reflected from the measurement target is incident into the housing 10 through the window portion 10a and is condensed by a condensing lens 58. The condensed interference light L1 of the measurement light is incident to the first light detector 6 along the Z-axis direction, and is detected by the first light detector 6.

On the other hand, the laser light L10 that is emitted from the second light source 7 is reflected by the second mirror 52 and the first mirror 51, and is incident to an optical surface 33a of the beam splitter unit 3 along the Z-axis direction. Interference light L11 of the laser light which is emitted from the optical surface 33a of the beam splitter unit 3 along the Z-axis direction is reflected by the first mirror 51, is transmitted through the second mirror 52, is reflected by the third mirror 53, is incident to the second light detector 8 and is detected by the second light detector 8.

In the optical module 1C, a length of an optical path between the beam splitter unit 3 and the first light source 5 is shorter than a length of an optical path between the beam splitter unit 3 and the second light source 7, and is shorter than a length of an optical path between the beam splitter unit 3 and the second light detector 8.

Specifically, a distance from an intersection between the optical path and the first mirror surface 31 of the beam splitter unit 3 to a light emission surface of the first light source 5 is shorter than a distance from the intersection between the optical path and the first mirror surface 31 of the beam splitter unit 3 to a light emission surface of the second light source 7, and is shorter than a distance from the intersection between the optical path and the first mirror surface 31 of the beam splitter unit 3 to a light incident surface of the second light detector 8. A distance from the intersection between the optical path and the first mirror surface 31 of the beam splitter unit 3 to a light emission surface of the collimator lens 5c of the first light source 5 is shorter than a distance from the intersection between the optical path and the first mirror surface 31 of the beam splitter unit 3 to a light emission surface of the collimator lens 73 of the second light source 7, and is shorter than a distance from the intersection between the optical path and the first mirror surface 31 of the beam splitter unit 3 to a light incident surface of the condensing lens 83 of the second light detector 8. A distance from the optical surface 33a of the beam splitter unit 3 to the light emission surface of the first light source 5 is shorter than a distance from the optical surface 33a of the beam splitter unit 3 to the light emission surface of the second light source 7, and is shorter than a distance from the optical surface 33a of the beam splitter unit 3 to the light incident surface of the second light detector 8. A distance from the optical surface 33a of the beam splitter unit 3 to the light emission surface of the collimator lens 5c of the first light source 5 is shorter than a distance from the optical surface 33a of the beam splitter unit 3 to the light emission surface of the collimator lens 73 of the second light source 7, and is shorter than a distance from the optical surface 33a of the beam splitter unit 3 to the light incident surface of the condensing lens 83 of the second light detector 8.

In the optical module 1C configured as described above, the first light source 5, the second light source 7, and the second light detector 8 are held by the holding unit 130 to face the same side (in this embodiment, the other side in the Z-axis direction). Accordingly, it is possible to constitute the interference optical system relating to the measurement light L0 and the interference optical system relating to the laser light L10 with a simple layout, and it is possible to carry out spectral analysis based on a detection result of the interference light L1 of the measurement light while acquiring a position of the movable mirror 22 in the Z-axis direction based on a detection result of the interference light L11 of the laser light. In addition, lead pins from the first light source 5, the second light source 7, and the second light detector 8 can be extended to the same side (in this embodiment, the one side in the Z-axis direction), and thus it is possible to realize integration of a circuit substrate for signal input/output with respect to the first light source 5, the second light source 7, and the second light detector 8. In addition, the first light source 5, the second light source 7, and the second light detector 8 are held by the holding unit 130 to be aligned in this order, and thus the length of the optical path between the beam splitter unit 3 and the first light source 5 is shorter than the length of the optical path between the beam splitter unit 3 and the second light source 7, and is shorter than the length of the optical path between the beam splitter unit 3 and the second light detector 8. Accordingly, it is possible to detect the interference light L1 of the measurement light with a sufficient light amount. As described above, according to the optical module 1C, it is possible to realize high-accuracy spectral analysis with a simple configuration.

In addition, in the optical module 1C, the first light source 5, the second light source 7, and the second light detector 8 are held by the holding unit 130 in a state in which the first light source 5 and the second light source 7 are adjacent to each other. Accordingly, it is possible to realize simplification of a configuration of the circuit substrate for signal input/output with respect to the first light source 5, the second light source 7, and the second light detector 8.

In addition, in the optical module 1C, the aperture 55 is disposed between the first mirror 51 and the first light source 5, and is held by the holding unit 130. Accordingly, a deviation is less likely to occur in a mutual positional relationship of the aperture 55 and the first light source 5. In addition, it is possible to realize higher accurate spectral analysis by cutting out an outer edge portion that may become a noise in the interference light L1 of the measurement light. In addition, it is possible to reduce a variation of a phase difference in a beam plane in the interference light L1 of the measurement light which is detected by the first light detector 6.

In addition, in the optical module 1C, the holding unit 130 holds the first light source 5, the second light source 7, and the second light detector 8 so that the first light source 5, the second light source 7, and the second light detector 8 face the other side in the Z-axis direction on one side of the beam splitter unit 3 in the Z-axis direction.

Accordingly, it is possible to realize a reduction in size of the optical module 1C in the Z-axis direction.

Fourth Embodiment

Figure 13:
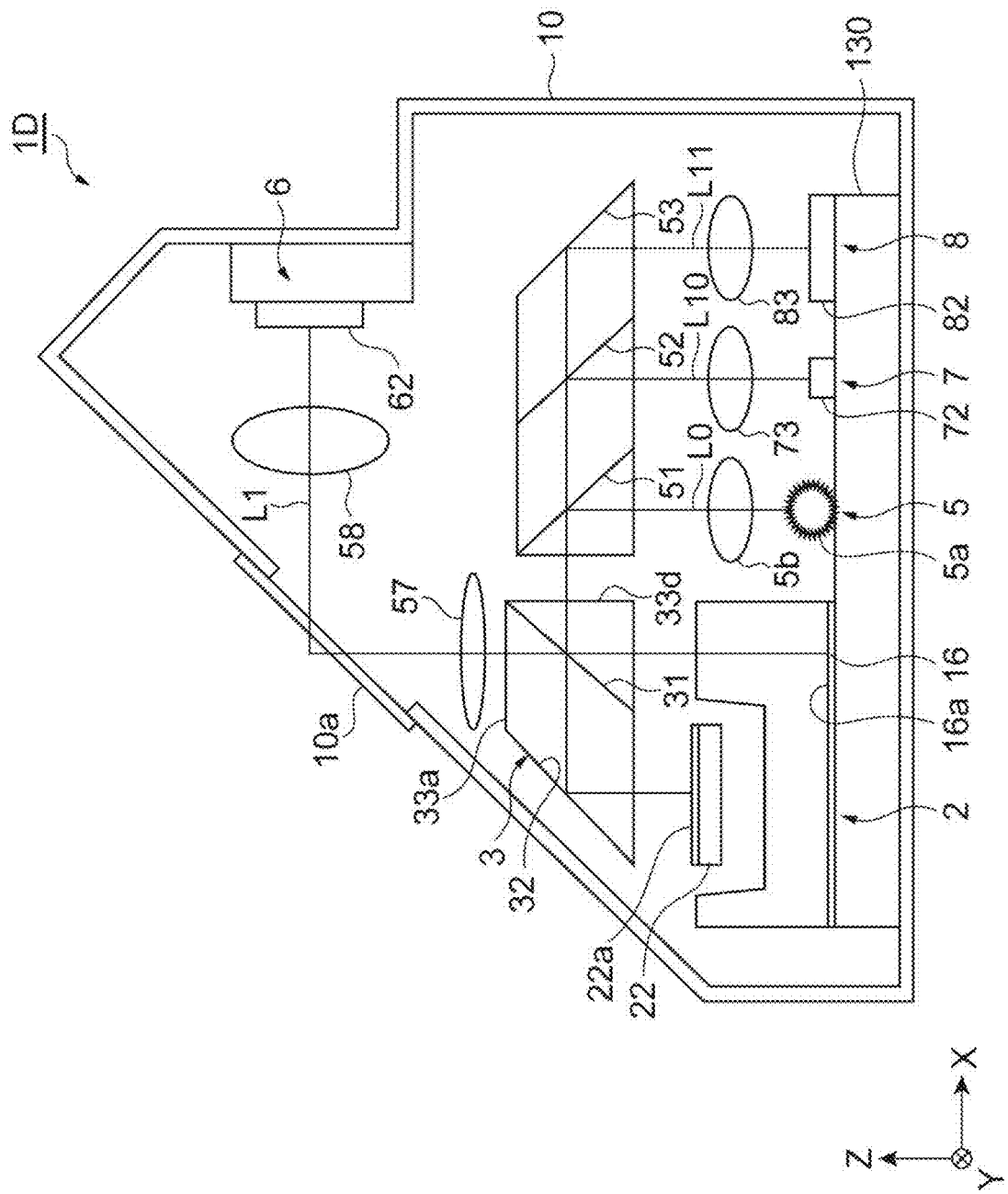
FIG. 13 is a schematic cross-sectional view of an optical module of a fourth embodiment.

As illustrated in FIG. 13, in an optical module 1D, a holding unit 130 holds a first light source 5, a second light source 7, and a second light detector 8 so that the first light source 5, the second light source 7, and the second light detector 8 face one side in the Z-axis direction on one side of a mirror unit 2 in the X-axis direction, and the first light source 5, the second light source 7, and the second light detector 8 are aligned in this order from the other side (that is, the mirror unit 2 side) in the X-axis direction.

The holding unit 130 holds a first mirror 51, a second mirror 52, and a third mirror 53 in addition to the first light source 5, the second light source 7, and the second light detector 8. The first mirror 51, the second mirror 52, and the third mirror 53 are constituted by a plurality of optical blocks which are joined to each other.

The first mirror 51 is a dichroic mirror that has a function of reflecting the measurement light L0 and allowing the laser light L10 to be transmitted therethrough, and is inclined with respect to an optical axis of the first light source 5. The first mirror 51 is disposed to overlap a beam splitter unit 3 when viewed form the X-axis direction, and to overlap the first light source 5 when viewed from the Z-axis direction. That is, the first mirror 51 is disposed to face the beam splitter unit 3 and the first light source 5. In this embodiment, an optical surface of the first mirror 51 is a surface that is parallel to the Y-axis direction and has an angle of 45° with respect to the Z-axis direction. The optical axis of the first light source 5 is parallel to the Z-axis direction.

The second mirror 52 is a mirror that has a function of reflecting a part of the laser light L10 and allowing the remainder of the laser light L10 to be transmitted therethrough, and is parallel to the first mirror 51. The second mirror 52 is disposed to overlap the first mirror 51 when viewed from the X-axis direction and to overlap the second light source 7 when viewed from the Z-axis direction. That is, the second mirror 52 is disposed to face the first mirror 51 and the second light source 7. In this embodiment, an optical surface of the second mirror 52 is a surface that is parallel to the Y-axis direction and has an angle of 45° with respect to the Z-axis direction.

The third mirror 53 is a mirror that has a function of reflecting the laser light L10 and is parallel to the second mirror 52. That is, third mirror 53 is disposed to overlap the second mirror 52 when viewed from the X-axis direction and to overlap the second light detector 8 when viewed from the Z-axis direction. That is, the third mirror 53 is disposed to face the second mirror 52 and the second light detector 8. In this embodiment, an optical surface of the third mirror 53 is a surface that is parallel to the Y-axis direction and has an angle of 45° with respect to the Z-axis direction.

In the optical module 1D, the measurement light L0 that is emitted from the first light source 5 along the Z-axis direction is reflected by the first mirror 51, and is incident to an optical surface 33d of the beam splitter unit 3 along the X-axis direction. Interference light L1 of the measurement light which is emitted from an optical surface 33a of the beam splitter unit 3 along the Z-axis direction is emitted to the outside of a housing 10 through a window portion 10a provided in the housing 10 while being condensed by a condensing lens 57, and is a measurement target (not illustrated) is irradiated with the interference light L1. The interference light L1 of the measurement light which is reflected from the measurement target is incident into the housing 10 through the window portion 10a and is condensed by a condensing lens 58. The condensed interference light L1 of the measurement light is incident to the first light detector 6 along the X-axis direction, and is detected by the first light detector 6.

On the other hand, the laser light L10 emitted from the second light source 7 is reflected by the second mirror 52, is transmitted through the first mirror 51, and is incident to the optical surface 33d of the beam splitter unit 3 along the X-axis direction. Interference light L11 of the laser light which is emitted from the optical surface 33d of the beam splitter unit 3 along the X-axis direction is transmitted through the first mirror 51 and the second mirror 52, is reflected by the third mirror 53, is incident to the second light detector 8, and is detected by the second light detector 8.

Even in the optical module 1D, as in the above-described optical module 1C, a length of an optical path between the beam splitter unit 3 and the first light source 5 is shorter than a length of an optical path between the beam splitter unit 3 and the second light source 7, and is shorter than a length of an optical path between the beam splitter unit 3 and the second light detector 8.

Specifically, a distance from an intersection between the optical path and the first mirror surface 31 of the beam splitter unit 3 to a light emission surface of the first light source 5 is shorter than a distance from the intersection between the optical path and the first mirror surface 31 of the beam splitter unit 3 to a light emission surface of the second light source 7, and is shorter than a distance from the intersection between the optical path and the first mirror surface 31 of the beam splitter unit 3 to a light incident surface of the second light detector 8. A distance from the intersection between the optical path and the first mirror surface 31 of the beam splitter unit 3 to a light emission surface of a condensing lens 5b of the first light source 5 is shorter than a distance from the intersection between the optical path and the first mirror surface 31 of the beam splitter unit 3 to a light emission surface of a collimator lens 73 of the second light source 7, and is shorter than a distance from the intersection between the optical path and the first mirror surface 31 of the beam splitter unit 3 to a light incident surface of a condensing lens 83 of the second light detector 8. A distance from the optical surface 33d of the beam splitter unit 3 to the light emission surface of the first light source 5 is shorter than a distance from the optical surface 33d of the beam splitter unit 3 to the light emission surface of the second light source 7, and is shorter than a distance from the optical surface 33d of the beam splitter unit 3 to the light incident surface of the second light detector 8. A distance from the optical surface 33d of the beam splitter unit 3 to the light emission surface of the condensing lens 5b of the first light source 5 is shorter than a distance from the optical surface 33d of the beam splitter unit 3 to the light emission surface of the collimator lens 73 of the second light source 7, and is shorter than a distance from the optical surface 33d of the beam splitter unit 3 to the light incident surface of the condensing lens 83 of the second light detector 8.

According to the optical module 1D configured as described above, as in the above-described optical module 1C, it is possible to realize high-accuracy spectral analysis with a simple configuration.

In addition, in the optical module 1D, the holding unit 130 holds the first light source 5, the second light source 7, and the second light detector 8 so that the first light source 5, the second light source 7, and the second light detector 8 face one side in the Z-axis direction on one side of the mirror unit 2 in the X-axis direction. Accordingly, it is possible to realize a reduction in size of the optical module 1D in the Z-axis direction. In addition, it is possible to realize integration of a circuit substrate for signal input/output with respect to the mirror unit 2, the first light source 5, the second light source 7, and the second light detector 8.

As in the above-described optical module 1C, the first mirror 51, the second mirror 52, and the third mirror 53 of the optical module 1D may be constituted by a plurality of optical plates which are separated from each other. In contrast, the first mirror 51, the second mirror 52, and the third mirror 53 of the above-described optical module 1C may be constituted by a plurality of optical blocks which are joined to each other as in the optical module 1D.

Modification Example

The mirror unit 2 is not limited to the above-described aspects as long as the mirror unit 2 includes the base 21, the movable mirror 22, and the fixed mirror 16. For example, the fixed mirror 16 may be provided in the mirror device 20. In addition, the mirror surface 16a of the fixed mirror 16 may not face the same side as in the mirror surface 22a of the movable mirror 22. In addition, the mirror unit 2 may include a plurality of the fixed mirrors 16. In this case, the interference optical system relating to the measurement light L0 and the interference optical system relating to the laser light L10 may be constituted by separate fixed mirrors 16. In addition, in the optical modules 1A, 1B, 1C, and 1D, the position of the second light source 7 and the position of the second light detector 8 may be substituted with each other.

In addition, the holding unit 130 is not limited to the above-described aspects as long as the holding unit 130 holds the first light detector 6, one of the second light source 7 and the second light detector 8, and the other of the second light source 7 and the second light detector 8 so that these parts face the same side. For example, the holding unit 130 may hold the first light detector 6, one of the second light source 7 and the second light detector 8, and the other of the second light source 7 and the second light detector 8 so that these parts face the other side (that is, the mirror unit 2 side) in the X-axis direction on one side of the mirror unit 2 in the X-axis direction. Similarly, the holding unit 130 is not limited to the above-described aspects as long as the holding unit 130 holds the first light source 5, one of the second light source 7 and the second light detector 8, and the other of the second light source 7 and the second light detector 8 so that these parts face the same side. For example, the holding unit 130 may hold the first light source 5, one of the second light source 7 and the second light detector 8, and the other of the second light source 7 and the second light detector 8 so that these parts face the other side (that is, the mirror unit 2 side) in the X-axis direction on the one side of the mirror unit 2 in the X-axis direction.

Figure 14:
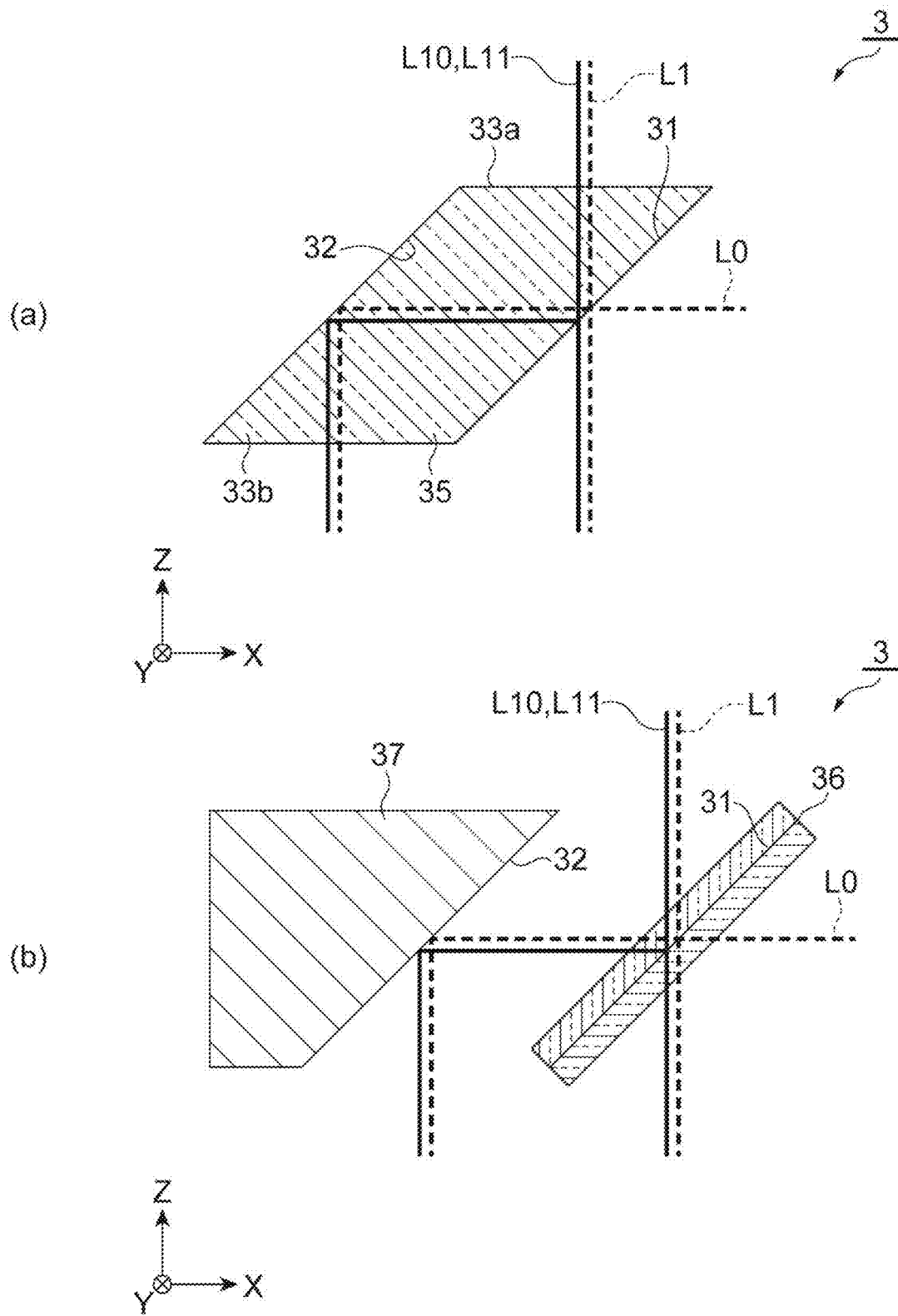
FIG. 14 is a cross-sectional view of a beam splitter unit of a modification example.

As illustrated in (a) of FIG. 14, the beam splitter unit 3 may be an optical block 35 in which a first mirror surface 31, a second mirror surface 32, and a plurality of optical surfaces 33a and 33b are formed. In addition, as illustrated in (b) of FIG. 14, the beam splitter unit 3 may be a combination of an optical plate 36 in which a first mirror surface 31 is formed, and a member 37 in which the second mirror surface 32 is formed. In the beam splitter unit 3 illustrated in (b) of FIG. 14, the optical plate 36 and the member 37 are separated from each other.

Figure 15:
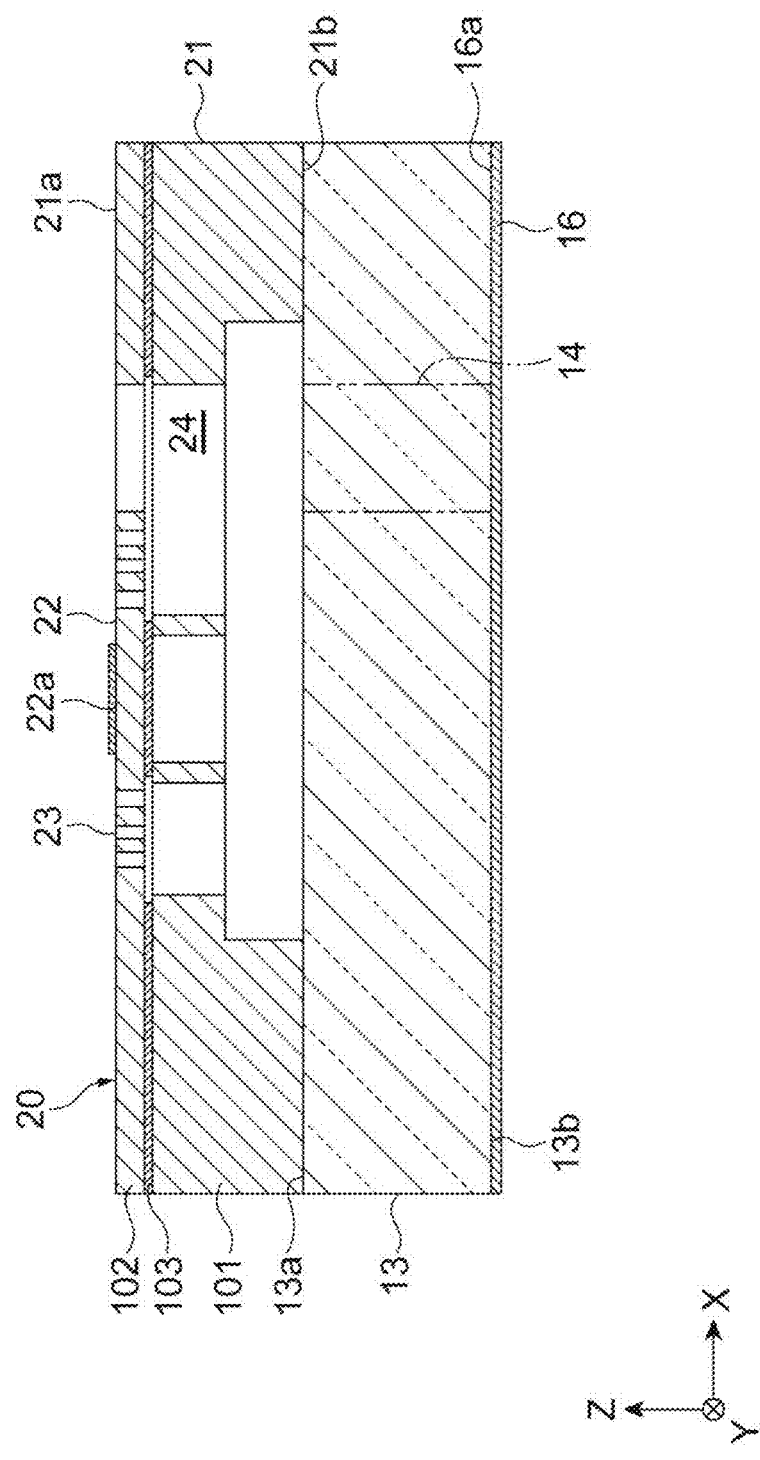
FIG. 15 is a schematic cross-sectional view of a mirror unit of the modification example.

In addition, with regard to the mirror unit 2, as illustrated in FIG. 15, in the mirror device 20, the second surface 21b (joining surface with the optical function member 13) of the base 21 may be a surface opposite to the intermediate layer 103 in the support layer 101, and the mirror surface 22a of the movable mirror 22 may be provided on a surface opposite to the intermediate layer 103 in the device layer 102. In this case, as in the mirror surface 22a, it is possible to provide the plurality of electrode pads 211 on the surface opposite to the intermediate layer 103 in the device layer 102, and thus it is possible to realize simplification of a process of manufacturing the mirror device 20, and a process of assembling the mirror unit 2. In addition, even in a case where the fifth surface 13d located on a further fourth surface 13b side in comparison to the third surface 13a is not provided in the optical function member 13, when the support layer 101 in a portion corresponding to the movable mirror 22 and the drive unit 23 is made thin, it is possible to prevent the movable mirror 22 and the drive unit 23 from coming into contact with the optical function member 13 when reciprocating the movable mirror 22 along the Z-axis direction.

Figure 16:
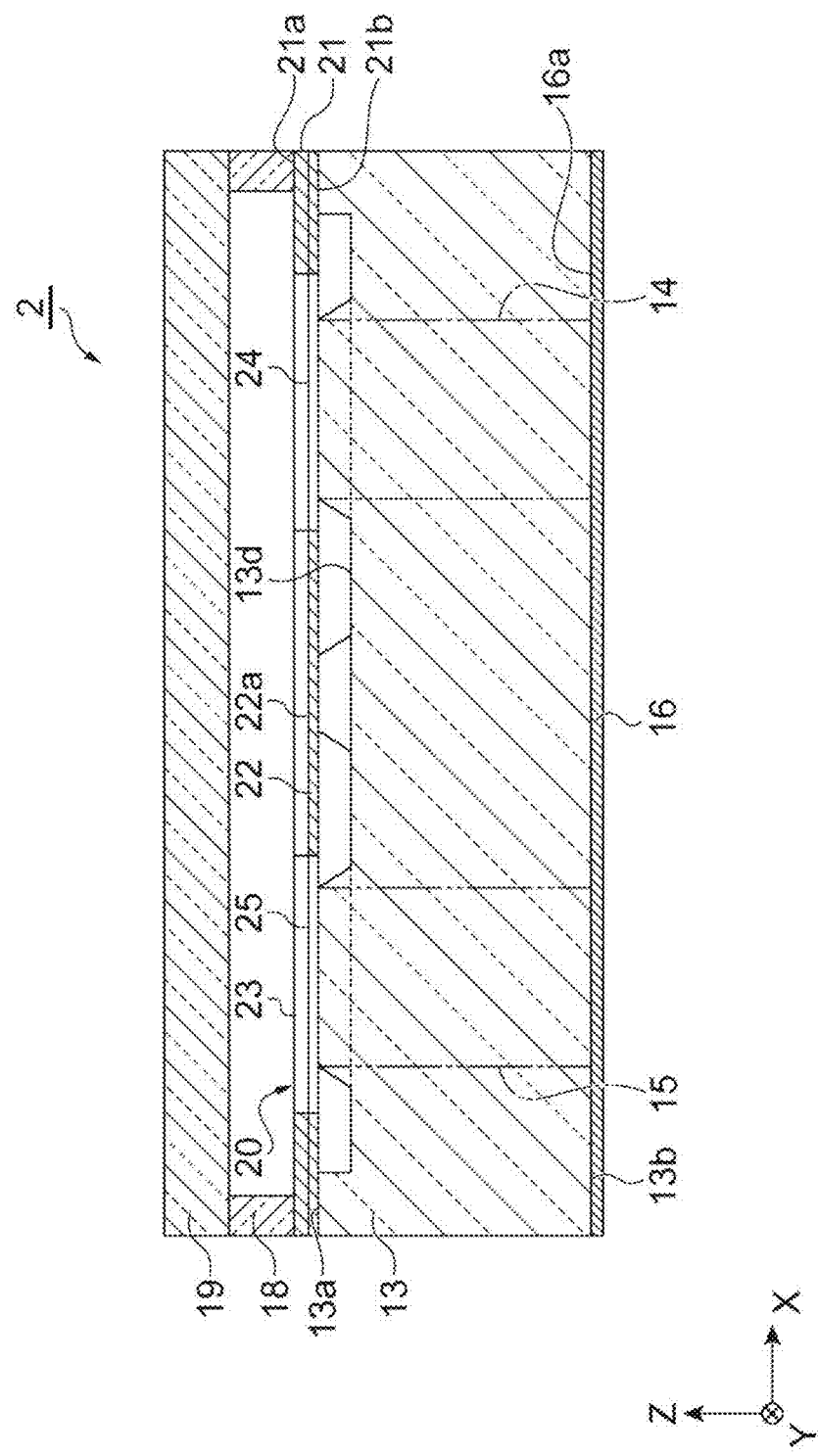
FIG. 16 is a cross-sectional view of the mirror unit of the modification example.
Figure 17:
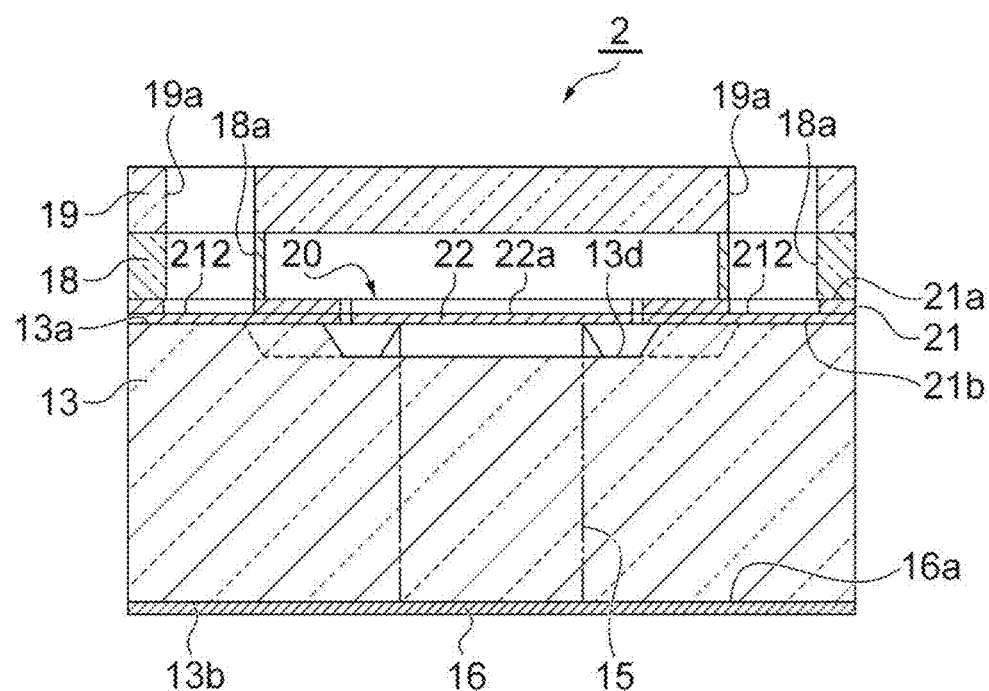
FIG. 17 is a cross-sectional view of the mirror unit of the modification example.
Figure 18:
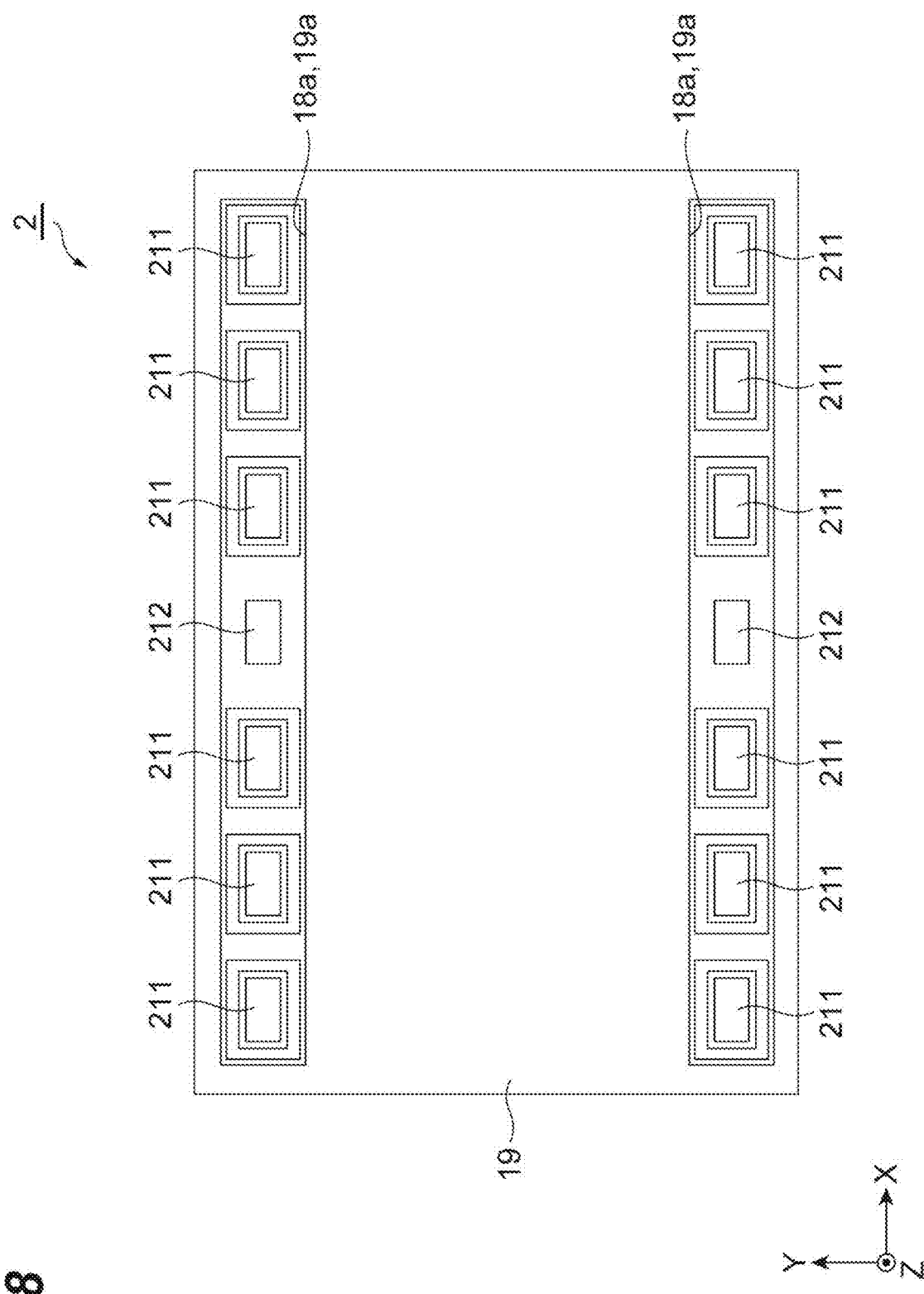
FIG. 18 is a plan view of the mirror unit of the modification example.

In addition, in the mirror unit 2, as illustrated in FIG. 16, FIG. 17, and FIG. 18, the movable mirror 22 and the drive unit 23 of the mirror device 20 may be disposed in an air-tight space (for example, an air-tight space in which the degree of vacuum is maintained to be high, or an air-tight space filled with an inert gas such as nitrogen). The mirror unit 2 illustrated in FIG. 16, FIG. 17, and FIG. 18 includes the mirror device 20, the optical function member 13, the fixed mirror 16, a frame body 18, and a light transmitting member 19. In the optical function member 13, the third surface 13a extends in a frame shape to surround the fifth surface 13d when viewed form the Z-axis direction. The third surface 13a extending in the frame shape is joined to the second surface 21b of the base 21 in the mirror device 20. The optical function member 13 and the base 21 are joined to each other by direct bonding. The fixed mirror 16 is formed on the fourth surface 13b of the optical function member 13.

The frame body 18 is formed to surround the movable mirror 22 and the drive unit 23 of the mirror device 20 when viewed from the Z-axis direction, and is joined to the first surface 21a of the base 21 in the mirror device 20. For example, the frame body 18 is formed of glass, and, for example, shows a rectangular frame shape. The base 21 and the frame body 18 are joined to each other by direct bonding. The light transmitting member 19 is formed to cover an opening of the frame body 18, and is joined to an end surface opposite to the mirror device 20 in the frame body 18. For example, the light transmitting member 19 is formed of glass, and, for example shows a rectangular plate shape. The frame body 18 and the light transmitting member 19 are joined to each other by direct bonding. In a surface of the light transmitting member 19 on the mirror device 20 side, a region that is not joined to the frame body 18 (that is, a region inside of the frame body 18 when viewed from the Z-axis direction) is subjected to antireflection coating (AR coating) with respect to light of a sensitivity wavelength of the optical module 1.

In this embodiment, a plurality of electrode pads 211 and one electrode pad 212 are arranged in a line along one portion extending along the X-axis direction and the other portion in the outer edge of the base 21. In respective rows, the one electrode pad 212 is located at the center. A pair of grooves 18a are formed in the frame body 18 to correspond to the plurality of electrode pads 211 and the one electrode pad 212 in the respective rows. A pair of grooves 19a are formed in the light transmitting member 19 to correspond to the plurality of electrode pads 211 and the one electrode pad 212 in the respective rows. According to this, it is possible to connect wires to the respective electrode pads 211 and 212 through the grooves 18a and the grooves 19a.

In the mirror unit 2 illustrated in FIG. 16, FIG. 17, and FIG. 18, the movable mirror 22 and the drive unit 23 of the mirror device 20 are disposed in an air-tight space, and thus it is possible to maintain the movable mirror 22 and the drive unit 23 in a highly reliable state. In addition, when the air-tight space is maintained in a decompressed state, it is possible to allow the movable mirror 22 and the drive unit 23 to smoothly operate.

The mirror unit 2 illustrated in FIG. 16, FIG. 17, and FIG. 18 can be manufactured with efficiency as follows. That is, a wafer (in which a layer that becomes the fixed mirror 16 is formed) including a plurality of portions each becoming the optical function member 13, a wafer including a plurality of portions each becoming the mirror device 20, a wafer including a plurality of portions each becoming the frame body 18, and a wafer including a plurality of portions each becoming the light transmitting member 19 are prepared, joining of the wafers is performed in a wafer level, and the resultant wafer including a plurality of portions each becoming the mirror unit 2 is cut into a plurality of mirror units 2. Even when the cutting is performed by blade dicing using water, since the movable mirror 22 and the drive unit 23 of the mirror device 20 are disposed in the air-tight space, it is possible to prevent the movable mirror 22 and the drive unit 23 from being broken by water.

The material of the optical function member 13, the frame body 18, and the light transmitting member 19 is not limited to glass, and for example, the material may be silicon. Particularly, the material of the optical function member 13 and the light transmitting member 19 is selected in accordance with the sensitivity wavelength of the optical module 1 so that the material is set to glass, for example, in a case where the sensitivity wavelength of the optical module 1 is a near infrared region, and the material is set to silicon, for example, in a case where the sensitivity wavelength of the optical module 1 is an intermediate infrared region. In a case where the material of the optical function member 13, the frame body 18, and the light transmitting member 19 is glass, a shape of these parts is formed, for example, by blast processing, etching, or the like. In a case where the material of the optical function member 13, the frame body 18, and the light transmitting member 19 is silicon, the shape of these parts is formed, for example, by etching.

Figure 19:
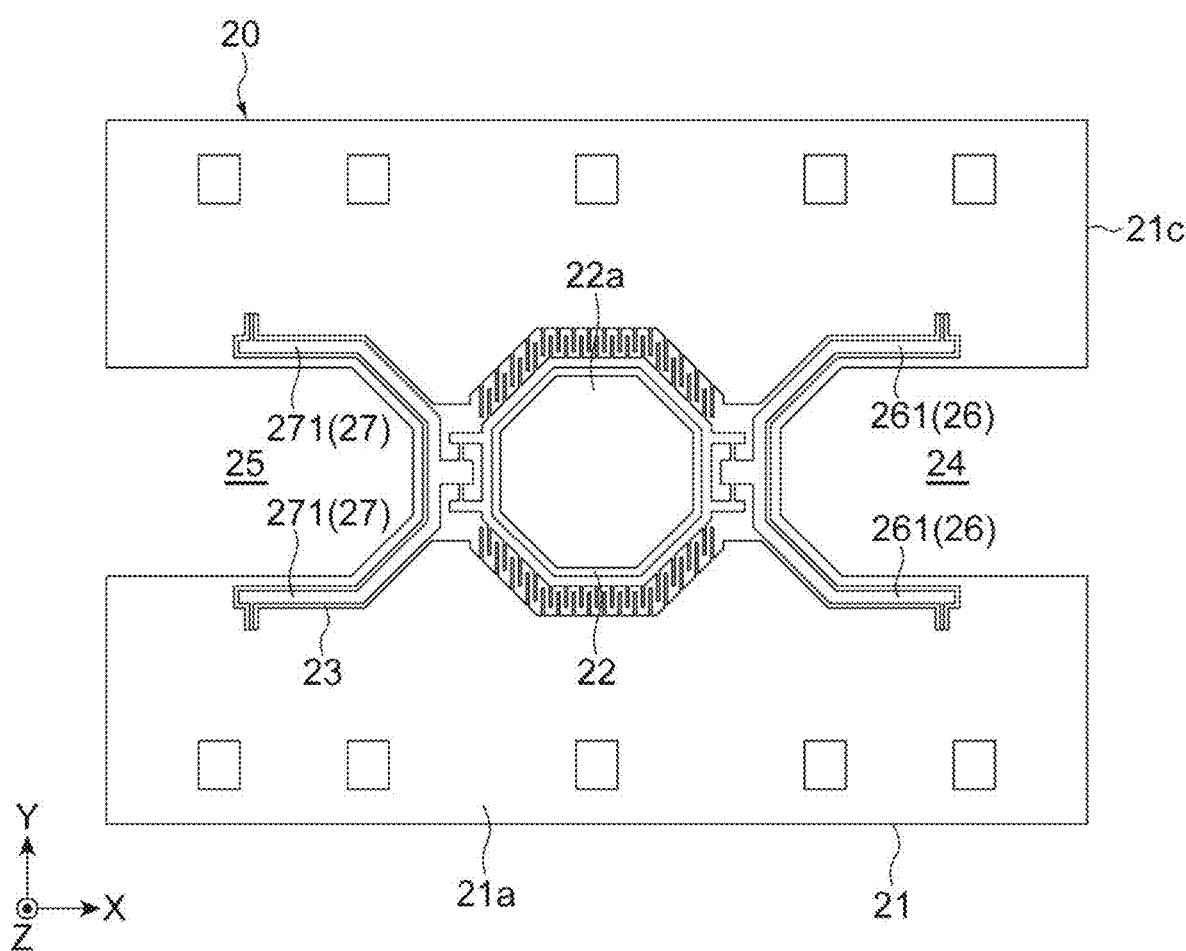
FIG. 19 is a plan view of a mirror device of the modification example.

In addition, as illustrated in FIG. 19, the light passage portion 24 of the mirror device 20 may be a notch that is formed in the base 21. In the mirror device 20 illustrated in FIG. 19, not only the light passage portion 24 but also the light passage portion 25 is a notch that is formed in the base 21. The light passage portion 24 is a notch that extends from a region between the pair of levers 261 in the base 21 to the outer edge 21c of the base 21. The light passage portion 25 is a notch that extends from a region between the pair of levers 271 in the base 21 to the outer edge 21e of the base 21. In the mirror device 20 illustrated in FIG. 19, the first elastic support unit 26 does not include the first link member 262, and the second elastic support unit 27 does not include the first link member 272.

In addition, as illustrated in (a) and (b) FIG. 20, the optical function member 13 may be provided with a light passage portion (second light passage portion) 13f instead of the light transmitting portion 14. In the optical function member 13 illustrated in (a) of FIG. 20, the light passage portion 13f is Ruined as a hole including a portion that faces the movable mirror 22 and the drive unit 23 of the mirror device 20. In the optical function member 13 illustrated in (b) of FIG. 20, the light passage portion 13f is formed as a notch including a portion that faces the movable mirror 22 and the drive unit 23 of the mirror device 20.

Figure 21:
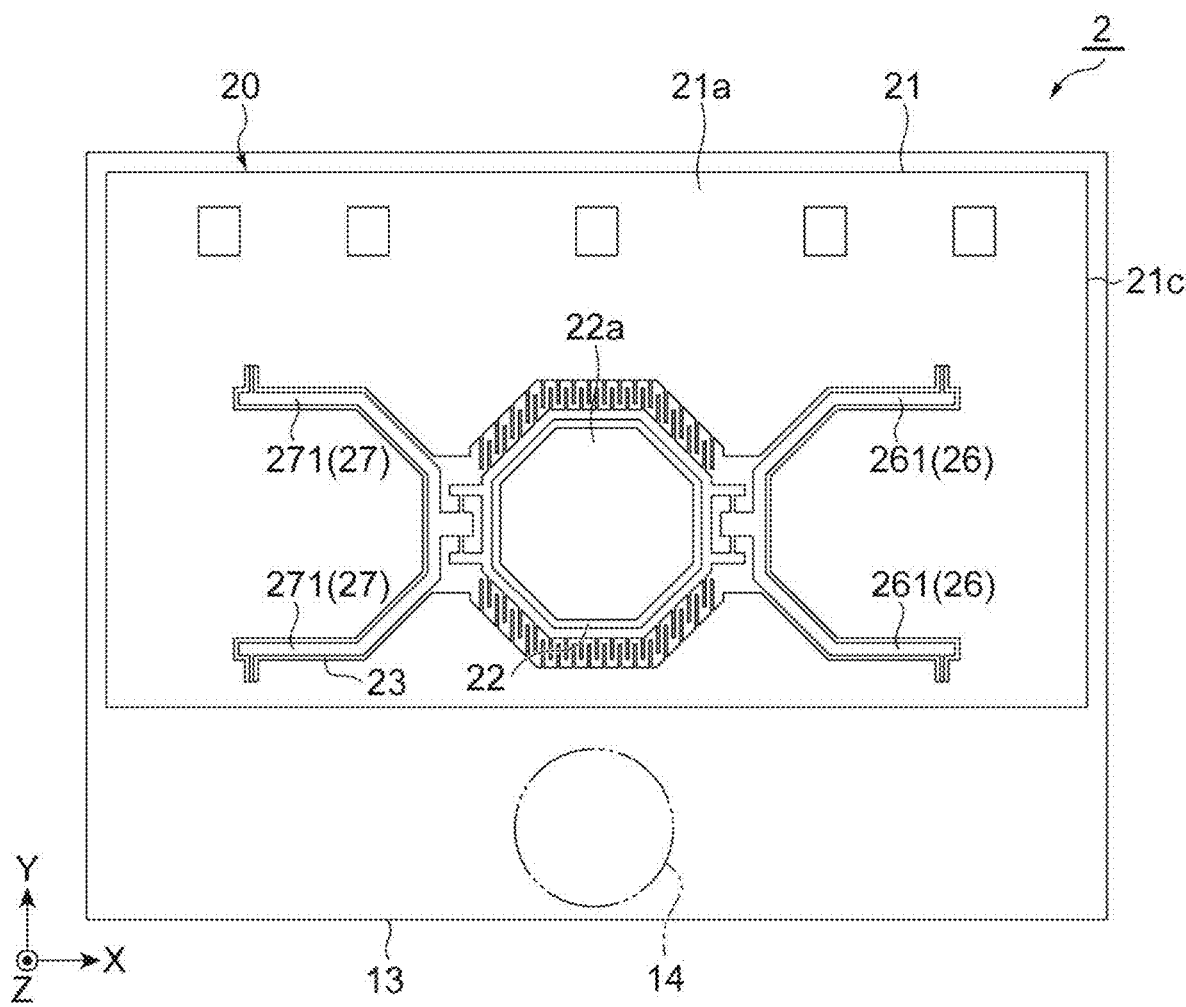
FIG. 21 is a plan view of the mirror unit of the modification example.

In addition, as illustrated in FIG. 21, the light passage portion 24 may not be provided in the mirror device 20. In the mirror unit 2 illustrated in FIG. 21, the light transmitting portion 14 is provided in a portion that does not overlap the mirror device 20 in the optical function member 13 when viewed from the Z-axis direction.

In addition, the drive unit 23 of the mirror device 20 may be provided with three or more elastic support units which elastically support the movable mirror 22. In addition, the drive unit 23 is not limited to a configuration in which the drive unit 23 is constituted by an electrostatic actuator, and may be constituted, for example, by a piezoelectric type actuator, an electromagnetic type actuator, or the like.

In addition, the second surface 21b of the base 21 and the third surface 13a of the optical function member 13 may be joined to each other by means (for example, an adhesive such as an UV curable resin) other than the direct bonding. In addition, the fixed mirror 16 may be separated from the fourth surface 13b of the optical function member 13 as long as the fixed mirror 16 is disposed on a side opposite to the mirror device 20 with respect to the optical function member 13.

In the configurations of the mirror unit 2, there is no limitation to the above-described materials and shapes, and various materials and shapes are applicable to the configurations. In addition, the configurations of the embodiment and the modification example are applicable to configurations in another embodiment and another modification example in an arbitrary manner.

REFERENCE SIGNS LIST 1A, 1B, 1C, 1D: optical module, 2: mirror unit, 3: beam splitter unit, 4: light incident unit, 5: first light source (first optical device), 6: first light detector (first optical device), 7: second light source (third optical device), 8: second light detector (second optical device), 16: fixed mirror, 21: base, 21a: first surface, 22: movable mirror, 51: first mirror, 52: second mirror, 53: third mirror, 54: filter, 55: aperture, 130: holding unit, L0: measurement light, L1: interference light of measurement light, L10: laser light, L11: interference light of laser light.

The invention claimed is:

1. An optical module comprising:
a mirror unit that includes a base including a first surface, a movable mirror that is supported in the base to be movable along a first direction that intersects the first surface, and a fixed mirror of which a position with respect to the base is fixed;
a beam splitter unit that is disposed on one side of the mirror unit in the first direction, and constitutes an interference optical system in combination with the movable mirror and the fixed mirror;
a light incident unit that causes measurement light that is incident from a first light source through a measurement target or measurement light that occurs from the measurement target to be incident to the beam splitter unit;
a first light detector that detects interference light of the measurement light which is emitted from the beam splitter unit;
a second light source that emits laser light to be incident to the beam splitter unit;
a second light detector that detects interference light of the laser light which is emitted from the beam splitter unit;
a holding unit that holds a first optical device, a second optical device, and a third optical device so that the first optical device that is the first light detector, the second optical device that is one of the second light source and the second light detector, and the third optical device that is the other of the second light source and the second light detector face the same side, and the first optical device, the second optical device, and the third optical device are aligned in this order;
a first mirror that is a dichroic mirror that has a function of allowing the measurement light to be transmitted therethrough and reflecting the laser light, or a function of reflecting the measurement light and allowing the laser light to be transmitted therethrough and is inclined with respect to an optical axis of the first optical device, and is disposed to face the beam splitter unit and the first optical device;
a second mirror that is a mirror that has a function of reflecting a part of the laser light and allowing the remainder of the laser light to be transmitted therethrough and is parallel to the first mirror, and is disposed to face the first mirror and the second optical device; and
a third mirror that is a mirror that has a function of reflecting the laser light and is parallel to the second mirror, and is disposed to face the second mirror and the third optical device,
wherein a length of an optical path between the beam splitter unit and the first optical device is shorter than a length of an optical path between the beam splitter unit and the second optical device, and is shorter than a length of an optical path between the beam splitter unit and the third optical device.

2. The optical module according to claim 1, wherein the second optical device is the second light detector, and the third optical device is the second light source.

3. The optical module according to claim 1, further comprising:
an aperture that is disposed between the first mirror and the first optical device,
wherein the aperture is held by the holding unit.

4. The optical module according to claim 1, further comprising:
a filter that is disposed between the light incident unit and the beam splitter unit,
wherein the filter has a function of cutting off the laser light, and is disposed in a state of being inclined with respect to an optical axis of the light incident unit.

5. An optical module comprising:
a mirror unit that includes a base including a first surface, a movable mirror that is supported in the base to be movable along a first direction that intersects the first surface, and a fixed mirror of which a position with respect to the base is fixed;
a beam splitter unit that is disposed on one side of the mirror unit in the first direction, and constitutes an interference optical system in combination with the movable mirror and the fixed mirror;
a first light source that emits measurement light to be incident to the beam splitter unit;
a first light detector that detects interference light of the measurement light which is emitted from the beam splitter unit and is incident through a measurement target;
a second light source that emits laser light to be incident to the beam splitter unit;
a second light detector that detects interference light of the laser light which is emitted from the beam splitter unit;
a holding unit that holds a first optical device, a second optical device, and a third optical device so that the first optical device that is the first light source, the second optical device that is one of the second light source and the second light detector, and the third optical device that is the other of the second light source and the second light detector face the same side, and the first optical device, the second optical device, and the third optical device are aligned in this order;
a first mirror that is a dichroic mirror that has a function of allowing the measurement light to be transmitted therethrough and reflecting the laser light, or a function of reflecting the measurement light and allowing the laser light to be transmitted therethrough and is inclined with respect to an optical axis of the first optical device, and is disposed to face the beam splitter unit and the first optical device;

a second mirror that is a mirror that has a function of reflecting a part of the laser light and allowing the remainder of the laser light to be transmitted therethrough and is parallel to the first mirror, and is disposed to face the first mirror and the second optical device; and a third mirror that is a mirror that has a function of reflecting the laser light and is parallel to the second mirror, and is disposed to face the second mirror and the third optical device, wherein a length of an optical path between the beam splitter unit and the first optical device is shorter than a length of an optical path between the beam splitter unit and the second optical device, and is shorter than a length of an optical path between the beam splitter unit and the third optical device.

6. The optical module according to claim 5, wherein the second optical device is the second light source, and the third optical device is the second light detector.

7. The optical module according to claim 5, further comprising:

an aperture that is disposed between the first mirror and the first optical device, wherein the aperture is held by the holding unit.

8. The optical module according to claim 1, wherein the first mirror, the second mirror, and the third mirror are held by the holding unit.

9. The optical module according to claim 1, wherein the holding unit holds the first optical device, the second optical device, and the third optical device so that the first optical device, the second optical device, and the third optical device face the other side in the first direction on the one side of the beam splitter unit in the first direction.

10. The optical module according to claim 1, wherein the holding unit holds the first optical device, the second optical device, and the third optical device so that the first optical device, the second optical device, and the third optical device face the one side in the first direction on one side of the mirror unit in a second direction that intersects the first direction.

* * * * *